United States Patent
Leung et al.

(10) Patent No.: US 8,787,864 B2
(45) Date of Patent: Jul. 22, 2014

(54) RECEIVER IIP2 ANALOG CALIBRATION

(71) Applicant: QUALCOMM Incorporated, San Deigo, CA (US)

(72) Inventors: Lai Kan Leung, San Marcos, CA (US); Gary John Ballantyne, Christchurch (NZ); Chiewcharn Narathong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/691,058

(22) Filed: Nov. 30, 2012

(65) Prior Publication Data

US 2014/0155014 A1 Jun. 5, 2014

(51) Int. Cl.
*H04B 1/26* (2006.01)

(52) U.S. Cl.
USPC .......... 455/323; 455/131; 455/260; 455/334; 375/345

(58) Field of Classification Search
USPC .......... 455/131, 230, 232.1, 234.1, 255–260, 455/313, 318, 323, 334, 338; 375/345
See application file for complete search history.

(56) References Cited

U.S. PATENT DOCUMENTS

| 5,586,147 | A  | * | 12/1996 | Kreuzgruber et al. | ........ 375/324 |
| 6,266,517 | B1 | * | 7/2001 | Fitzpatrick et al. | ........ 455/114.3 |
| 7,212,588 | B1 | * | 5/2007 | Wong et al | ....................... 375/324 |
| 7,450,911 | B1 | * | 11/2008 | Venkatesh | ........................ 455/73 |
| 7,656,931 | B2 | * | 2/2010 | Smith et al. | ..................... 375/131 |
| 7,660,338 | B2 | * | 2/2010 | Smith et al. | ..................... 375/131 |
| 8,060,043 | B2 |   | 11/2011 | Pratt et al. | |
| 2009/0154595 | A1 |   | 6/2009 | Choksi et al. | |
| 2011/0128992 | A1 |   | 6/2011 | Maeda et al. | |
| 2011/0201296 | A1 |   | 8/2011 | Kaczman et al. | |
| 2012/0077452 | A1 |   | 3/2012 | Dufrene et al. | |

\* cited by examiner

*Primary Examiner* — Nhan Le

(57) ABSTRACT

Techniques for performing analog calibration of a receiver to optimize a second-order input intercept point (IIP2). In an aspect, a signal generator modeling an interferer is coupled to an adjustable input of a receiver, e.g., a gate bias voltage of a mixer. For example, the signal generator output may be a single-tone on-off keying (OOK) modulated signal. The mixer mixes the signal down to baseband, wherein an analog correlator correlates the down-converted signal with the known sequence of bits used to perform the OOK modulation. The analog correlation output is then provided to drive the bias voltage in the mixer, e.g., one or more gate voltages of transistors in the differential mixer, to optimize the overall receiver IIP2. Further aspects of the disclosure provide for calibrating receivers having multiple LNA's, and also dual or diversity receivers having multiple receive paths.

22 Claims, 19 Drawing Sheets

Baseband filter of secondary receiver, configured as integrator

RECEIVER IIP2 ANALOG CALIBRATION

BACKGROUND

1. Field

The disclosure relates to analog techniques for calibrating a second-order input-intercept point (IIP2) of a radio-frequency (RF) receiver.

2. Background

In communications circuitry, the linearity of a receiver is an important factor determining its dynamic range. One common measure of receiver linearity is second-order input intercept point, or IIP2. Receiver IIP2 may depend on various factors, including non-ideal mismatch between semiconductor devices in the receiver. For example, one determinant of receiver IIP2 is mismatch between the transistors forming a differential pair in a down-conversion mixer.

To reduce the effects of transistor mismatch on IIP2, different gate bias voltages may be applied to the transistors within a differential pair of the receiver. The optimal settings for these gate bias voltages, or other voltages used to tune IIP2, may be determined according to an IIP2 calibration scheme. An interferer carrying a known pre-modulated sequence may be applied to the receiver input, and the interferer may be down-converted by the mixers. The down-converted signal may then be digitally correlated with the known pre-modulated sequence, and adjustments may be made to the gate bias voltages of the transistors in the down-conversion mixer (or other circuitry) to maximize the correlation between the sequence and the received signal.

IIP2 calibration schemes may generally perform the correlation in the digital domain using a digital processor. However, performing digital correlation may introduce substantial delay into the calibration control loop, as the signals following down-conversion, which are analog, must first be digitized by an analog-to-digital converter (ADC) prior to sending to the digital processor. Furthermore, the gate voltages applied to the transistors must be analog, which then requires a digital-to-analog converter (DAC) following the digital processor. The convergence time of digital calibration will thus be limited by ADC/DAC resolution and speed, and slow data converters will undesirably increase the time needed to perform IIP2 calibration. If the receiver supports multiple frequency bands and modes, and therefore includes a plurality of mixers, then the time needed to perform IIP2 calibration would further be correspondingly multiplied for each receiver. On the other hand, performing IIP2 calibration in the analog domain poses a variety of challenges, including the need to provide accurate analog computation elements that can also be flexibly configured to suit the calibration requirements.

It would be desirable to provide fast and efficient techniques for performing receiver IIP2 calibration.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
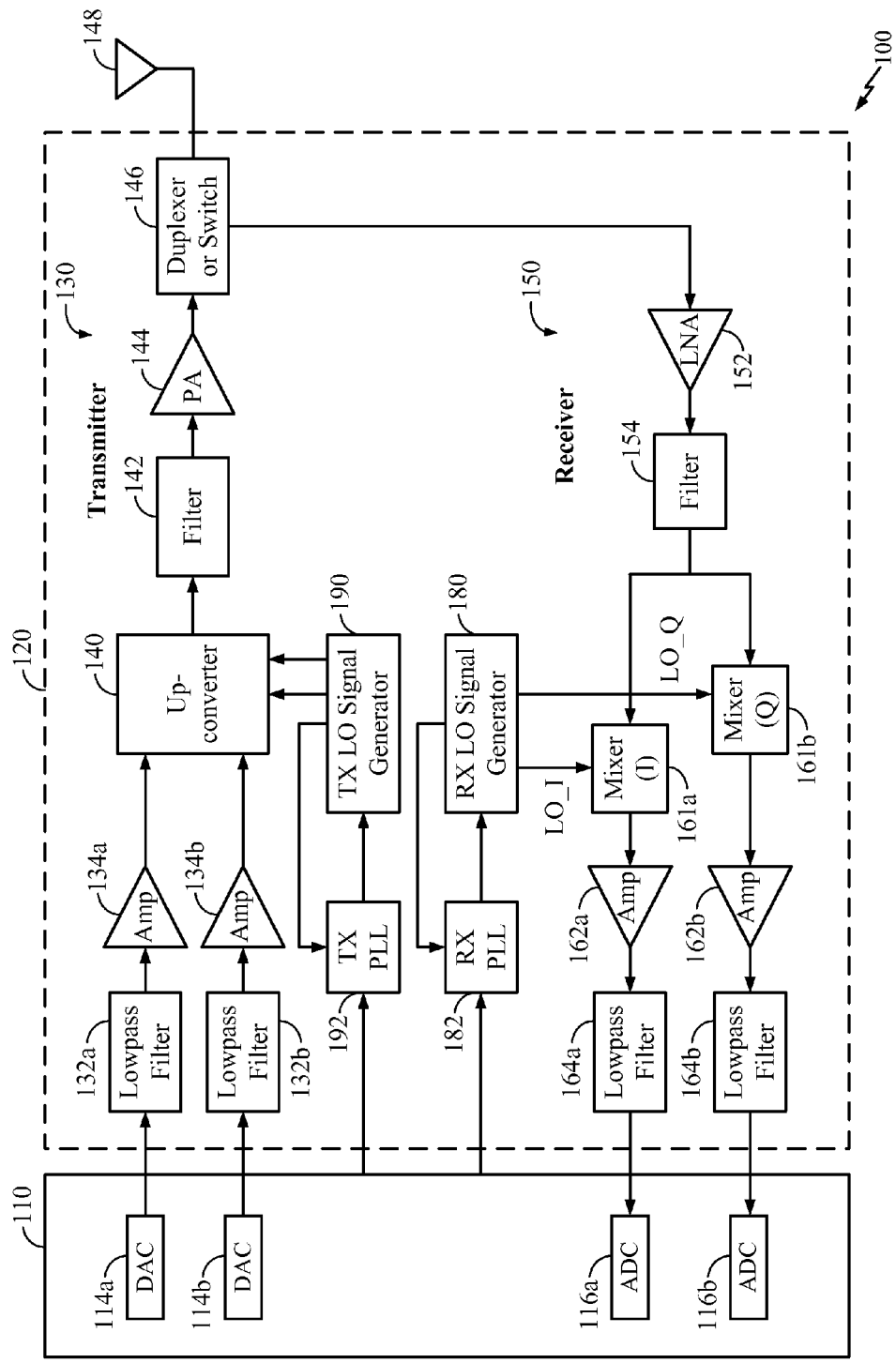
FIG. 1 illustrates a block diagram of a design of a wireless communication device 100 in which the techniques of the present disclosure may be implemented.

FIG. 1 illustrates a block diagram of a design of a wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114a and 114b for converting digital signals generated by the data processor 110 into the I and Q analog output signals, e.g., I and Q output currents, for further processing.

Within transmitter 130, lowpass filters 132a and 132b filter the I and Q analog output signals, respectively, to remove undesired images caused by the prior digital-to-analog conversion. Amplifiers (Amp) 134a and 134b amplify the signals from lowpass filters 132a and 132b, respectively, and provide I and Q baseband signals. An upconverter 140 upconverts the I and Q baseband signals with I and Q transmit (TX) local oscillating (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The received RF signal is amplified by LNA 152 and filtered by a filter 154 to obtain a desirable RF input signal. Downconversion mixers 161a and 161b mix the output of filter 154 with I and Q receive (RX) LO signals (i.e., LO_I and LO_Q) from an RX LO signal generator 180 to generate I and Q baseband signals. The I and Q baseband signals are amplified by amplifiers 162a and 162b and further filtered by lowpass filters 164a and 164b to obtain I and Q analog input signals, which are provided to data processor 110. In the exemplary embodiment shown, the data processor 110 includes analog-to-digital-converters (ADC's) 116a and 116b for converting the analog input signals into digital signals to be further processed by the data processor 110.

TX LO signal generator 190 generates the I and Q TX LO signals used for frequency upconversion. RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

A significant factor determining the dynamic range of the receiver portion 150 is the second-order intercept point, or IIP2, of the receiver. It will be appreciated that the receiver IIP2 may be determined, e.g., by mismatches between transistors of one or more differential pairs present in each of the mixers 161a, 161b, as well as other factors known to one of ordinary skill in the art. Note while certain exemplary embodiments are described herein with reference to adjusting mixer gate voltages to calibrate receiver IIP2, it will be appreciated that one of ordinary skill in the art may readily apply the techniques disclosed herein to adjust other parameters (alternatively or in conjunction with mixer gate voltages) to optimize receiver IIP2. Examples of such other parameters that may be adjusted include any voltage imbalance between the positive and negative terminals of a low-noise amplifier (LNA), and/or imbalance present in amplifiers or filters following the down-converters. Such alternative exemplary embodiments are contemplated to be within the scope of the present disclosure.

Figure 2:
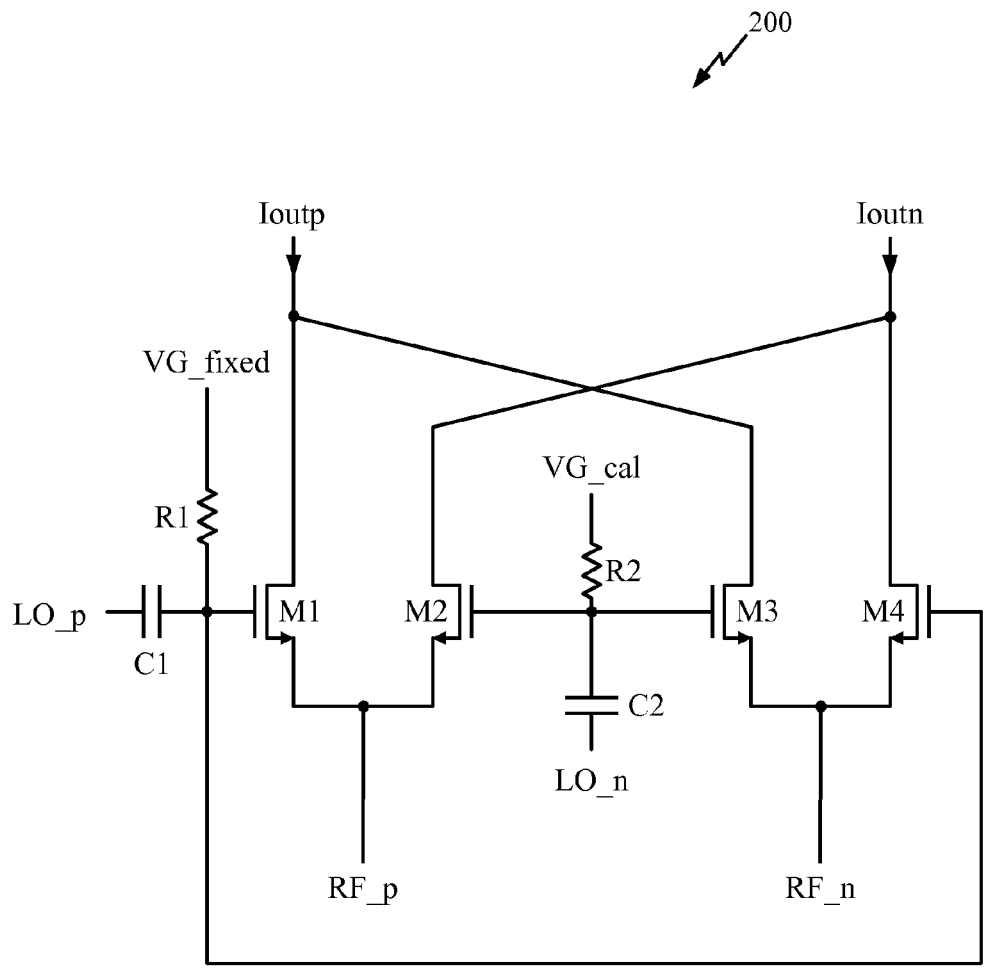
FIG. 2 illustrates an example implementation of a mixer, e.g., the in-phase (I) mixer or the quadrature (Q) mixer, having a configurable gate voltage for IIP2 calibration.

FIG. 2 illustrates an example implementation of a mixer 200, e.g., the in-phase (I) mixer 161a or the quadrature (Q) mixer 161b, having a configurable gate voltage for IIP2 calibration. Note while FIG. 2 shows one exemplary embodiment of a mixer, one of ordinary skill in the art will appreciate that the techniques disclosed herein may readily be applied to other mixer configurations as well, e.g., other passive or active mixer configurations known in the art. Such alternative exemplary embodiments are contemplated to be within the scope of the present disclosure.

In FIG. 2, a first differential pair formed by transistors M1, M2 has drains cross-coupled with the drains of a second differential pair formed by transistors M3, M4 to generate a differential output current (Ioutp, Ioutn). A differential LO voltage LO_p, LO_n (e.g., corresponding to a differential version of either LO_I or LO_Q generated by block 180 in FIG. 1) is coupled to the gates of the transistors via C1, C2, while a differential RF voltage RF_p, RF_n (e.g., corresponding to the output of filter 154 in FIG. 1) is coupled to the sources of the transistors. The gates of M1 and M4 are biased to a fixed gate bias voltage VG_fixed via resistor R1, while the gates of M2 and M3 are biased to a variable gate bias voltage VG_cal via resistor R2. It will be appreciated that, by keeping VG_fixed constant, and varying VG_cal, the IIP2 of the mixer 200 may be correspondingly varied. In an exemplary embodiment of the present disclosure, by applying a suitable algorithm to vary VG_cal while monitoring a signal derived from the mixer output, preferred settings of VG_cal may be determined such that the IIP2 of the mixer 200 is optimized.

Note in FIG. 2, while one bias voltage VG_fixed is fixed and the other bias voltage (VG_cal) is variable, alternative exemplary embodiments may instead vary both bias voltages to adjust the differential bias between the transistor gates. Furthermore, it will be understood that varying one or two or more bias voltages could readily be applied to other circuitry whose bias voltages may be adjusted (in a single-ended or differential manner) to optimize IIP2, e.g., LNA bias voltages, baseband element bias voltages, etc. Such alternative exemplary embodiments are contemplated to be within the scope of the present disclosure. In this specification and in the claims, any such parameter (e.g., differential or single-ended) whose value may be adjusted based to optimize IIP2 may be denoted an "adjustable input" of a receiver.

Figure 3:
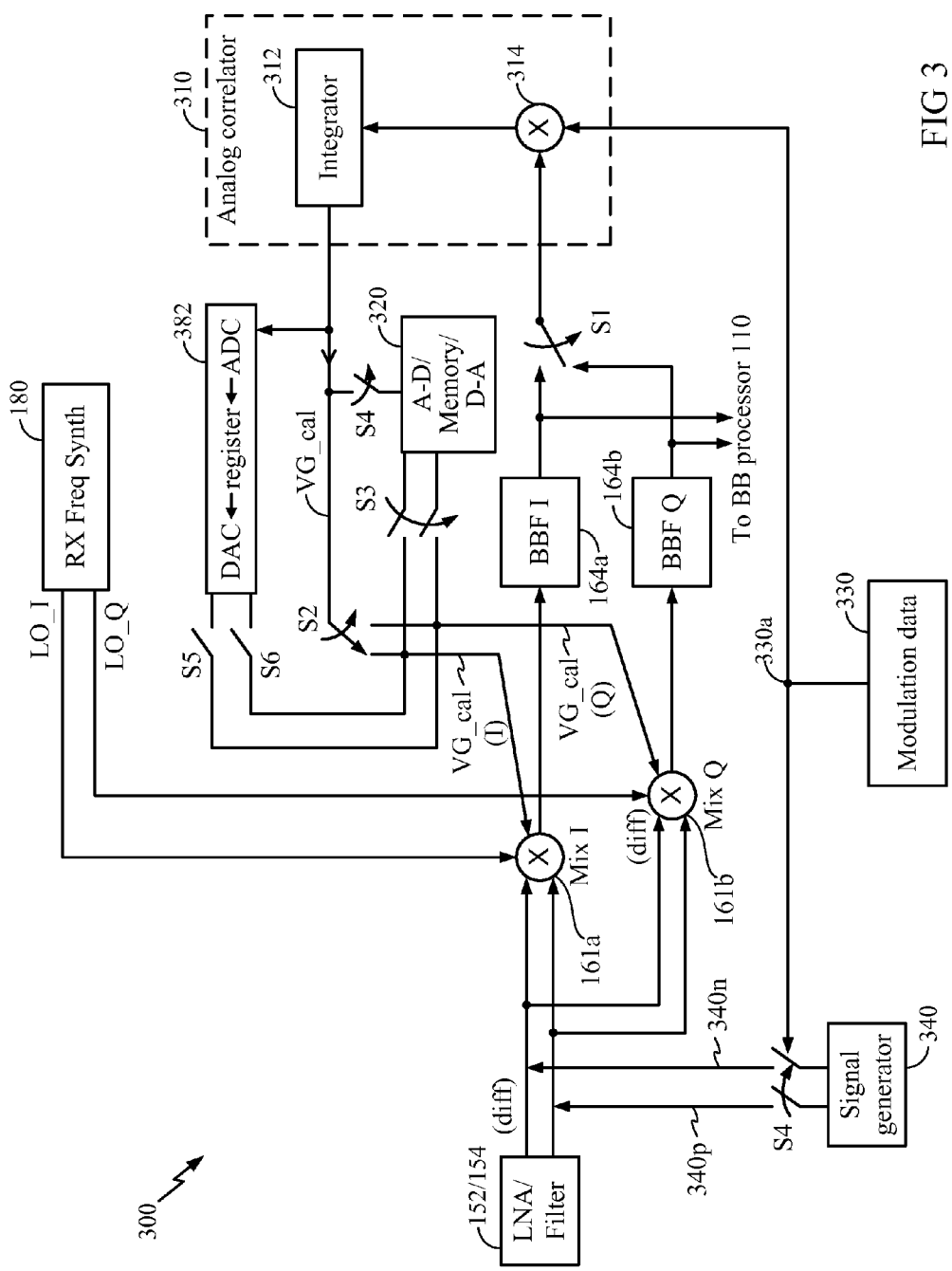
FIG. 3 illustrates an exemplary embodiment of a system providing for analog calibration of a receiver mixer to optimize IIP2.

FIG. 3 illustrates an exemplary embodiment of a system 300 providing for analog calibration of a receiver mixer to optimize IIP2. Note FIG. 3 is shown for illustrative purposes only, and is not meant to limit the scope of the present disclosure. Further note that certain elements have been omitted from FIG. 3 for ease of illustration, and also that similarly labeled elements in FIGS. 1, 2, and 3 may correspond to elements performing similar functions, unless otherwise noted. In this specification and in the claims, unless otherwise noted, an "analog" element may denote an element designed to process signals, at either its input or output, having non-discretized amplitude levels. Furthermore, "analog" calibration may refer to any calibration of a system wherein a control loop is used to determine preferred settings of one or more parameters, and wherein the signals directly in the control loop signal path are processed as non-discretized signals.

In FIG. 3, the LNA 152 and filter 154 of a receiver are shown as a composite block 152/154. The differential output signal (diff) of block 152/154 is coupled to the inputs of both the mixer I 161a and mixer Q 161b. Per the techniques of the present disclosure, the inputs of mixer I 161a and mixer Q 161b may also be coupled to the differential outputs of a signal generator 340. In an exemplary embodiment, the signal generator 340 may generate a tone having a single frequency. The single frequency may be chosen to model interference or signal frequencies of interest in determining the IIP2 of the receiver. The output of the signal generator 340 may be coupled via switches S4 to the mixer inputs. The switches S4 may be selectively opened and closed to couple or decouple the output of signal generator 340 to the mixer inputs. In an exemplary embodiment, the selective closing and opening are based on binary data 330a provided by a modulation data generator 330.

It will be appreciated that providing the switches S4 to modulate the output of signal generator 340 effectively applies on-off keying (OOK) as the type of modulation. However, one of ordinary skill in the art will appreciate that in alternative exemplary embodiments, modulation types other than OOK may readily be employed. For example, any variant of amplitude modulation may be effectively applied according to the techniques of the present disclosure, and such alternative exemplary embodiments are contemplated to be within the scope of the present disclosure. In an exemplary embodiment, the data used to perform the modulation may include an alternating sequence of 0's and 1's, or a pseudo-random sequence of bits, or any other suitable data sequence.

Further note that, in alternative exemplary embodiments, the output of signal generator 340 may instead be coupled to alternative nodes in the system, e.g., to a single-ended or differential LNA input(s), or other internal nodes of the LNA, to optimize IIP2 by adjusting the voltages applied to such alternative nodes in the system. Such alternative exemplary embodiments are contemplated to be within the scope of the present disclosure.

In FIG. 3, the differential modulated outputs 340p, 340n of the signal generator 340 are directly coupled via switches S4 to the differential inputs of the mixers 161a, 161b, e.g., using on-chip conductive metal or polysilicon leads. In this manner, the number of routings required in the system may be substantially reduced in comparison with an implementation wherein, e.g., a signal tone is injected into the LNA input for the purpose of IIP2 calibration. This is because, in a multi-mode receiver, a plurality of LNA's (e.g., one LNA for each expected receive frequency) may generally be employed for each set of mixers, which would require a corresponding plurality of routings to the output of the signal generator 340 if 340p, 340n were to be injected into each LNA.

It will further be appreciated that, by coupling the output of signal generator 340 directly to the mixer input via switches S4, the output power of the signal generator 340 may be made significantly less than, e.g., certain implementations in which a filter or other attenuating element is present between the mixer input and the signal interference source used for IIP2 calibration. Note, however, that, in an alternative exemplary embodiment (not shown), if the signal generator output is coupled to the LNA input, then the signal generator output power may be made less than would be required if coupled to the mixer input, due to the additional gain that would be provided by the LNA. Such alternative exemplary embodiments are contemplated to be within the scope of the present disclosure.

In an aspect of the exemplary embodiment 300 of FIG. 3, as the output of signal generator 340 is injected differentially into the mixer inputs, as opposed to being injected in a single-ended manner into, e.g., a single-ended LNA input, the differential routings shown in FIG. 3 are expected to minimize any even-order harmonics in the output of the signal generator 340. In an exemplary embodiment, during an IIP2 calibration phase of the system, the LNA 152 may be powered down, or otherwise configured to generate no output power. Nevertheless, in alternative exemplary embodiments (e.g., as described with reference to FIG. 9) wherein the signal generator output is provided to the LNA input, the LNA 152 may be powered on during IIP2 calibration.

It will be appreciated that while coupling the output of signal generator 340 directly to the mixer inputs affords the advantages described hereinabove, the scope of the present disclosure is not limited to exemplary embodiments that incorporate this feature. For example, certain alternative exemplary embodiments may adopt other aspects of the present disclosure, e.g., calibration of IIP2 using analog calibration techniques, etc., without coupling the output of signal generator 340 directly to the mixers. In such alternative exemplary embodiments, the output of signal generator 340 may be coupled to the input of the LNA (see, e.g., the exemplary embodiment described with reference to FIG. 9 hereinbelow), or alternative nodes (not shown) within the LNA architecture, etc. Such alternative exemplary embodiments are contemplated to be within the scope of the present disclosure.

The mixers 161a, 161b are configured to mix their differential inputs with either LO_I or LO_Q generated by the RX frequency synthesizer 180. In an exemplary embodiment, the tone of the signal generator 340 is configured to have a frequency (or "tone frequency") equal to the transmit frequency (e.g., uplink frequency) of the transceiver 120 (e.g., to act as a jammer for the receiver), while the frequency of the LO (e.g., LO_I and LO_Q outputs of the RX frequency synthesizer 180) is set to the receive frequency (e.g., downlink frequency). In alternative exemplary embodiments, the tone frequency may be alternatively set, and may be, e.g., much further away from the transmit frequency if the overall IIP2 of the receiver is not frequency-dependent. It will be appreciated that an advantage of setting the tone frequency further away from the transmit frequency is that the down-converted baseband signal will accordingly lie at the difference between the tone and transmit frequencies, which may be well outside the bandwidth of the baseband filters (e.g., filters 164a, 164b in FIG. 3), and thus may be significantly attenuated by the baseband filters. At the same time, the IM2 tone (i.e., the second intermodulation tone, or the tone created by the IIP2 of the mixer), which may be determined by the modulation rate of the modulation data output of generator 330, may stay within the baseband filter bandwidth, to maintain adequate signal-to-noise ratio for the IM2 tone. It is advantageous to keep the signal-to-noise ratio of the IM2 tone high so that it can be detected and minimized by the correlator 310. Note in other alternative exemplary embodiments, the local oscillators LO_I and LO_Q may be configured to have the same frequency as the tone generated by the signal generator 340.

The outputs of mixers 161a, 161b are coupled to I and Q baseband filters 164a, 164b, respectively. The outputs of filters 164a, 164b are coupled to a switch S1, which may selectively couple the output of either filter 164a or filter 164b to a multiplier 314 of an analog correlator 310. The multiplier 314 is configured to multiply the output of either filter 164a or filter 164b to the output of the modulation data generator 330, i.e., the same data that was used to modulate the output of the signal generator 340 for coupling to the mixer inputs. In an exemplary embodiment, to account for any path delay introduced by the elements 161a, 161b, 164a, 164b, etc., one or more delay elements (not shown) may be further provided to delay the output of the modulation data generator 330 prior to multiplication by 314, such that the inputs to the multiplier 314 are appropriately aligned in time.

An integrator 312 integrates the output of multiplier 314, and generates a voltage VG_cal as the output. In an exemplary embodiment, switch S2 selectively couples VG_cal to the calibration voltage input of either the I mixer 161a or the Q mixer 161b (see, e.g., VG_cal as denoted in FIG. 2). Switches S1 and S2 are configured to be synchronized in time, i.e., S1 and S2 will simultaneously select either the I signal path or Q signal path for processing at any given time. Note providing the switches S1 and S2 advantageously reduces the hardware requirements of the system by allowing both I and Q paths to share a single correlator 310. However, it will be appreciated that in alternative exemplary embodiments, separate correlators may be provided for the I and Q paths, in which case the switches S1 and S2 may be omitted. Such alternative exemplary embodiments are contemplated to be within the scope of the present disclosure.

It will be appreciated that the system 300 effectively implements closed-loop control of the gate bias voltage VG_cal for both the I mixer 161a and the Q mixer 161b, wherein VG_cal (I) and VG_cal(Q) are driven over time to values that optimize the IIP2 of the receiver. Note in alternative exemplary embodiments, switch S2 may be alternatively configured to selectively couple the output of correlator 310 to other adjustable inputs of the receiver for adjusting IIP2, and such alternative exemplary embodiments are contemplated to be within the scope of the present disclosure.

In an exemplary embodiment, the multiplier 314 is an analog multiplier, i.e., configured to process analog input signals without amplitude discretization. Similarly, the integrator 312 may be an analog integrator which directly generates an analog output voltage VG_cal from an analog input voltage, and thus the correlator 310 may be denoted an analog correlator. It will be appreciated that providing an analog correlator may be advantageous over a digital correlator for a number of reasons. In particular, the time delay of digitizing a signal, digitally performing the correlation, and re-converting the correlation output back to analog is advantageously eliminated. In addition, no post-processing operations, e.g., fast Fourier-transforms (FFT's) are required, as may be utilized if the correlation is implemented in a digital processor. Furthermore, the analog correlator may advantageously be integrated with the rest of the analog receiver circuitry, e.g., mixers 161a and 161b, filters 164a and 164b, etc., on a single chip, and thus no serial-bus communications (e.g., SBI) between analog and digital integrated circuits (IC's) are required.

Yet another advantage of analog over digital correlation in IIP2 calibration is that, in digital implementations, the resolution and speed of the ADC/DAC will also affect the accuracy and speed of the calibration. For example, in those cases wherein the IM2 tone amplitude is actually below the resolution of the ADC, then IIP2 calibration may undesirably fail or take an inordinately long time to complete.

In an exemplary embodiment, following convergence of the output of the analog correlator 310 to a preferred value that optimizes IIP2, the preferred output(s) may be stored in a memory block 382 for later retrieval. For example, to determine convergence of the output of the analog correlator 310, a predetermined delta threshold may be chosen, and changes in the receiver IIP2 with respect to variation of the adjusted inputs (e.g., gate calibration voltage) may be monitored. If the changes in the receiver IIP2 are less than the predetermined delta threshold for a successive number of iterations, then a preferred setting of the parameters may be declared and stored in memory. Note the preceding description is only one example of a possible scheme to determine convergence, and one of ordinary skill in the art may readily derive other schemes. Such alternative exemplary embodiments are contemplated to be within the scope of the present disclosure.

The memory block 382 advantageously allows for maintaining the determined preferred settings of the gate calibration voltages for the mixers 161a, 161b during normal operation of the receiver. Note the preferred settings of the gate calibration voltages may be determined, e.g., during the calibration phase of the receiver, as further described hereinbelow with reference to FIG. 8, and switches S5/S6 may be provided to select the applied gate voltages for the mixers from either the output of the analog correlator 310 (during calibration) or the output of the memory block 382 (during normal operation). In an exemplary embodiment, the memory block 382 may include an ADC to digitize the determined optimal parameter settings, one or more digital registers to store the parameters, and a DAC to convert the stored digital voltages to analog voltages for application to the circuitry, e.g., mixer gates. In an exemplary embodiment, separate registers may be used to store the preferred gate voltage for each mixer transistor having configurable gate voltage. Note as the ADC and DAC of the memory block 382 would not be provided directly in the signal path of the analog control loop of the IIP2 calibration mechanism described, and rather only serve to digitize and store the gate voltages determined by the control loop for subsequent application during normal operation, the memory block 382 advantageously introduces no additional delay in the control loop. Thus the calibration scheme shown in FIG. 3 is characterized as a type of "analog" calibration scheme, even in view of the presence of the ADC and DAC in memory block 382. In an exemplary embodiment, the analog correlator 310 can be shut off during normal operation, and thus any noise arising from the analog correlator 310 can be decoupled from the receiver.

Figure 4:
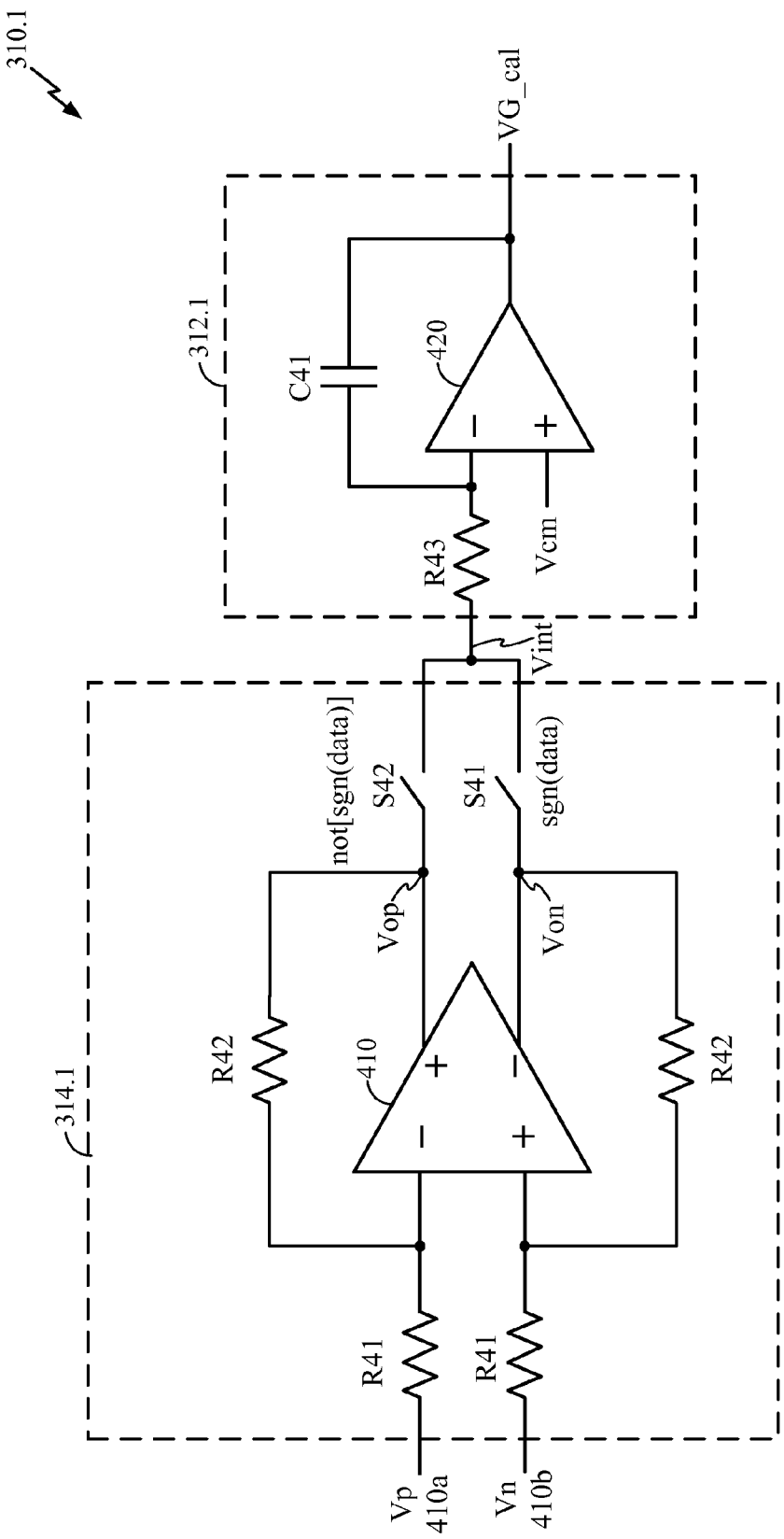
FIGS. 4, 4A, and 4B illustrate an exemplary embodiment of an analog correlator and associated signal waveforms.

FIG. 4 illustrates an exemplary embodiment 310.1 of an analog correlator 310. Note FIG. 4 is shown for illustrative purposes only, and is not meant to restrict the scope of the present disclosure to any particular exemplary embodiment of a correlator. In alternative exemplary embodiments, other implementations of an analog correlator may readily be employed, and such alternative exemplary embodiments are contemplated to be within the scope of the present disclosure.

In FIG. 4, a differential voltage input to a multiplier portion 314.1 of the analog correlator 310.1 is shown as Vp, Vn. The voltages are coupled via matched resistors R41 to the negative (−) and positive (+) terminals of an op amp 410. The differential positive (+) and negative (−) outputs of op amp 410 are further coupled back to the inputs via matched feedback resistors R42. It will be appreciated that by adjusting the relative values of R42 and R41, the gain of the amplifier 314.1 may be adjusted, according to principles known in the art. The op amp 410 generates a differential output voltage Vop, Von, corresponding to an amplified version of the differential input voltage Vp Vn.

The outputs of op amp 410 are coupled to switches S41 and S42. In the exemplary embodiment shown, S41 may be configured as follows. When binary data from the data generator 330 equals 1, then S41 is closed, and when the binary data equals 0, then S41 is opened. Simultaneously, S42 may be configured in the opposite manner, i.e., S42 is opened when the data equals 1, and closed when the data equals 0. (One of ordinary skill in the art will appreciate that in alternative exemplary embodiments, the reverse convention may readily be adopted without altering the operation of the circuit, e.g., S41 may be closed when the data equals 0, etc.) In this manner, a single-ended voltage Vint is generated that corresponds to an amplified version of Vp, Vn having a first polarity when data equals 0, and an amplified version of Vp, Vn having a second polarity opposite the first polarity when data equals 1.

In FIG. 4, Vint is further coupled to an integrator portion 312.1 of the analog correlator 310.1. In particular, Vint is coupled to a negative (−) input of op amp 420 via a resistor R43. A capacitor C41 is coupled from the output of op amp 420 to its negative (−) input, and a DC voltage Vcm is provided to a positive (+) input of op amp 420, to configure the op amp 420 as an integrator according to principles known in the art. In particular, the output voltage VG_cal of op amp 420 will correspond to an integrated version of Vint.

It will be appreciated that implementing the multiplier 314 using a signum [or sgn(•)] function considerably simplifies design of the circuitry. Furthermore, the system 300 incorporating the analog integrator 310.1 effectively implements closed-loop control of VG_cal according to a signed least-mean square (LMS) algorithm. In particular, the implemented signed LMS algorithm may be mathematically expressed as follows (Equation 1):

$$VG\_cal = \int \gamma \cdot sgn(\mu) \cdot (Vp - Vn) dt;$$

$$= \gamma \left[ \int_0^{t_1} (Vp - Vn) dt - \int_{t_1}^{t_2} (Vp - Vn) dt + \ldots + \int_{t_{n-2}}^{t_{n-1}} (Vp - Vn) dt - \int_{t_{n-1}}^{t_n} (Vp - Vn) dt \right];$$

wherein γ represents the gain of the multiplier (e.g., as dependent on the ratio between R42 and R41) and the gain of the integrator, and $t_1, t_2, \ldots, t_n$ represent the time instants marking the symbol periods corresponding to the output of OOK modulation data generator 330.

Figure 4A:
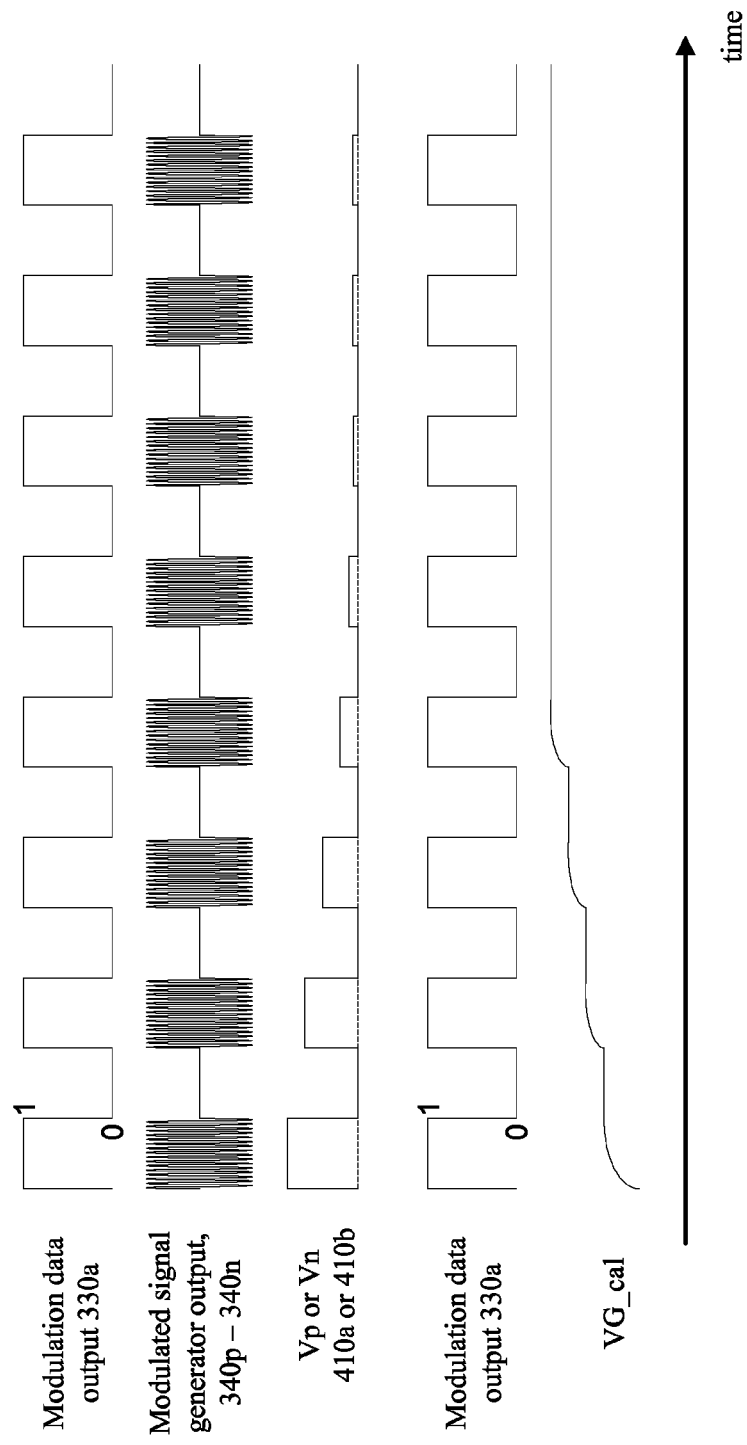

FIG. 4A illustrates an exemplary instance of signal waveforms present in the system 300 and circuitry 310.1 of FIGS. 3 and 4. Note FIG. 4A is shown for illustrative purposes only, and is not meant to limit the scope of the present disclosure to any particular instances of signals within the system and circuitry.

In FIG. 4A, an exemplary sequence of 1's and 0's is shown for modulation data output 330a. According to an exemplary embodiment wherein OOK is used for modulation, the differential output 340p-340n of the signal generator is generated as shown. Following processing by the down-conversion mixers 161a, 161b and baseband filters 164a, 164b, etc., baseband signals are input to the analog correlator 310, shown as Vp or Vn (410a or 410b). Vp and Vn each correspond to one end of a differential signal (Vp−Vn) generated by one of the BBF's 164a, 164b.

In FIG. 4A, it can be seen that the height of the pulses in Vp or Vn (corresponding to the "ON" time intervals of the OOK modulation) gradually decreases over time, due to the action of the closed-loop control mechanism earlier described hereinabove. FIG. 4A further shows the evolving value of VG_cal over time. Per the principles of operation of the circuitry in FIG. 4 described hereinabove, it can be seen that, when modulation data output 330a is high (corresponding to data=1), charge accumulates on the capacitor C41, while when modulation data output 330a is low (corresponding to data=0), charge does not accumulate on C41. Over time, VG_cal is seen to approach a steady-state value wherein the IM2 products in Vp or Vn are minimized.

Figure 4B:
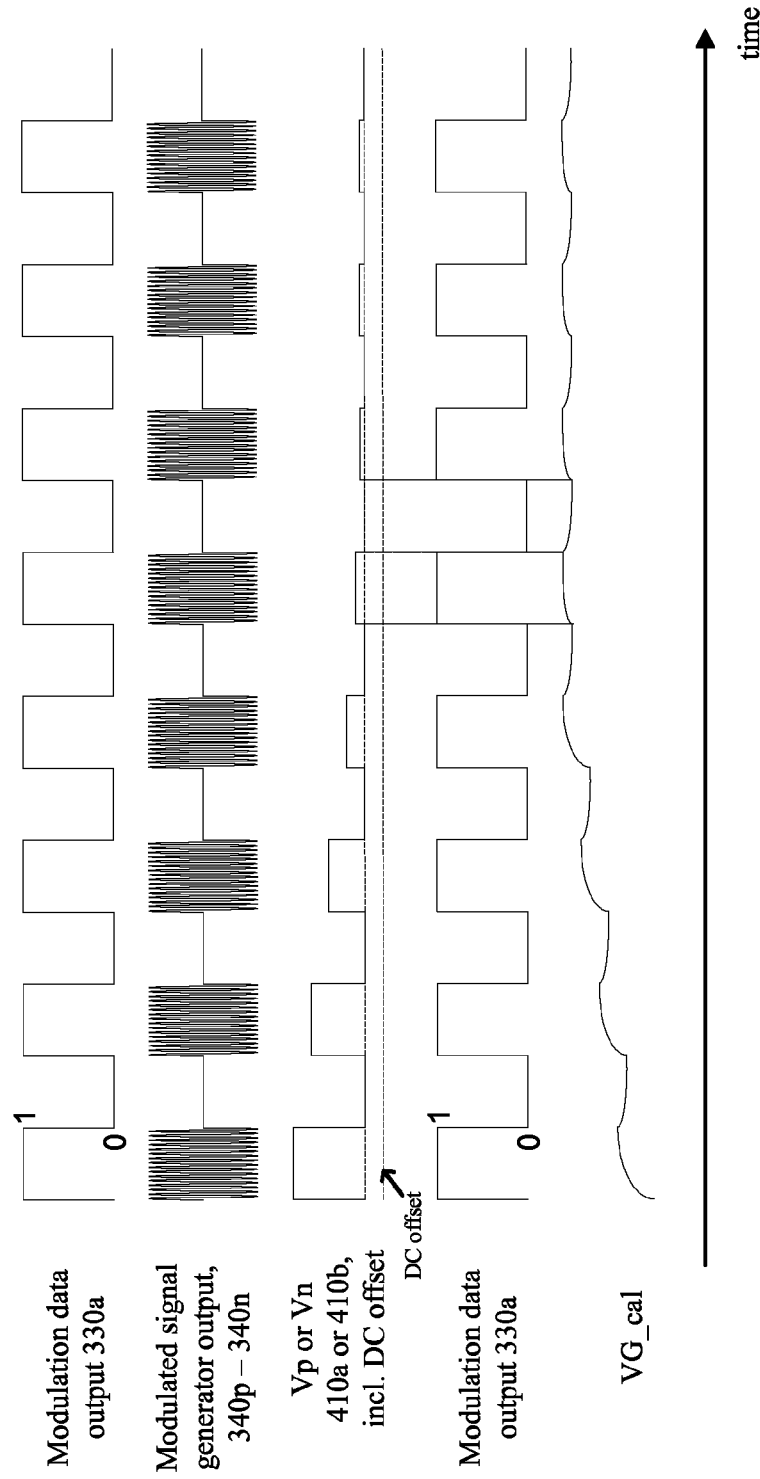

FIG. 4B illustrates an alternative exemplary instance of signal waveforms present in the system 300 and circuitry 310.1 of FIGS. 3 and 4. The waveforms in FIG. 4B are similar to those in FIG. 4A, except that a constant DC offset is further shown as being present in Vp or Vn. It will be appreciated that such DC offset may arise due to, e.g., second-order non-linearities, self-mixing of the LO and/or other signals, etc. From inspection of the circuitry of FIG. 4, it will be appreciated that DC offset voltage at the input of the integrator 312.1 can be cancelled due to the positive and negative integration of the input signals. In particular (Equation 2):

$$VG\_cal = \gamma \left[ \int_0^{t_1} (Vp - Vn + Voffset) dt - \int_{t_1}^{t_2} (Vp - Vn + Voffset) dt + \ldots + \int_{t_{n-2}}^{t_{n-1}} (Vp - Vn + Voffset) dt - \int_{t_{n-1}}^{t_n} (Vp - Vn + Voffset) dt \right];$$

wherein Voffset corresponds to the DC offset. Note that assuming $t_n - t_{n-1} = t_{n-1} - t_{n-2}$, and Voffset is constant, then Voffset can be effectively eliminated over time. Thus it will be appreciated that the analog correlator 310 can be designed to be tolerant to a certain amount of DC offset voltage.

While, as described hereinabove, the analog integrator 314.1 can be configured to continuously integrate the analog multiplier output Vint regardless of the value of the modulation data, this need not be the case in all exemplary embodiments. For example, in certain exemplary embodiments (not shown in the figures), whenever modulation data is equal to zero (i.e., during the "off" periods if on-off keying modulation is applied), the analog integrator 314.1 may be put in an idle mode to save power. For example, during such idle modes, the op amp 410 may be turned off, and the input switches S41 and S42 may both be opened. Such an exemplary embodiment may be utilized when, e.g., the DC offset present at Vint is not expected to be high. Such alternative exemplary embodiments are contemplated to be within the scope of the present disclosure.

Figure 5:
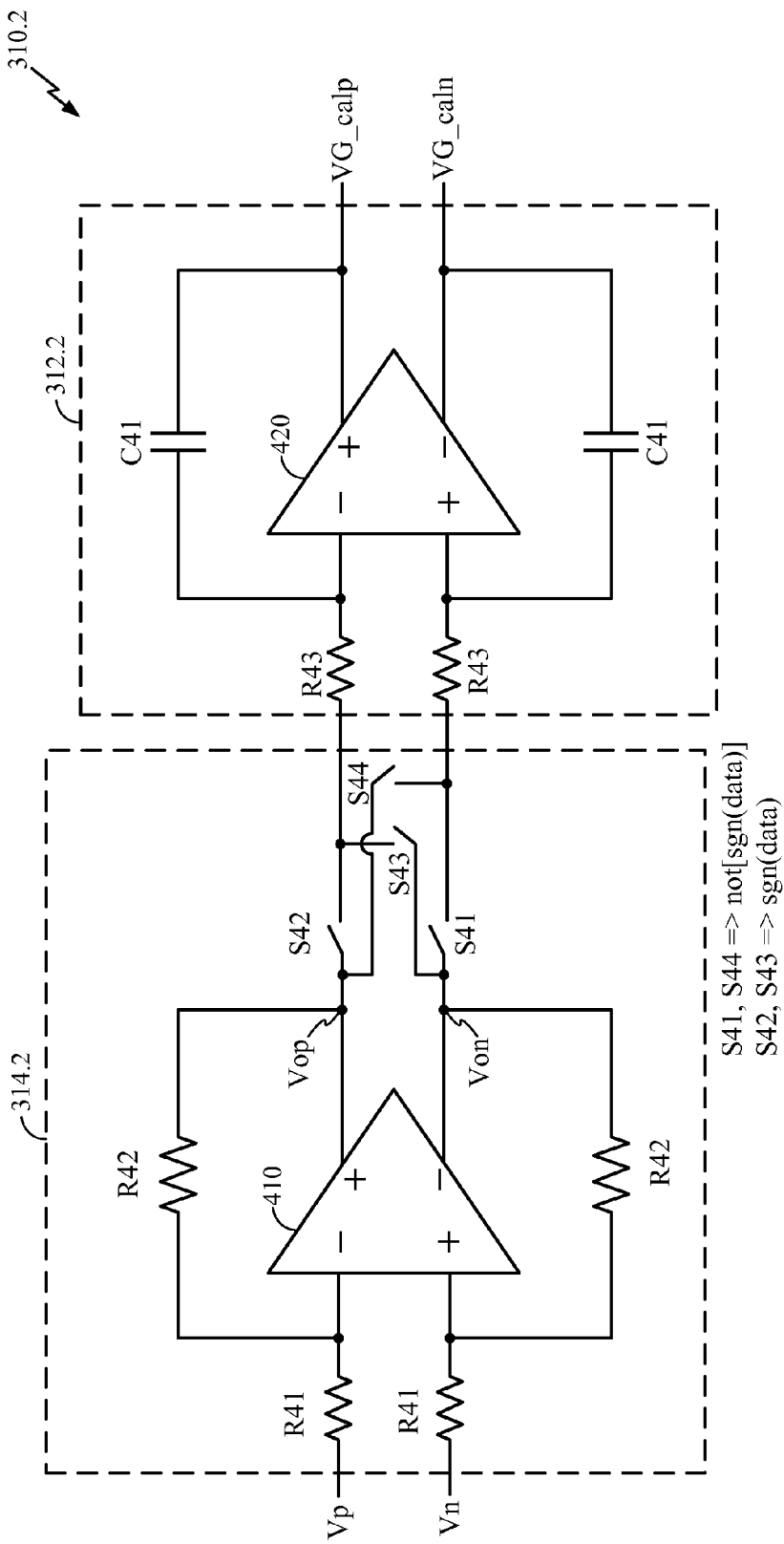
FIG. 5 illustrates an alternative exemplary embodiment of correlator, wherein the analog correlator stage directly inputs and processes a differential voltage from the multiplier and generates a differential voltage VG_calp, VG_caln.

FIG. 5 illustrates an alternative exemplary embodiment 310.2 of correlator 310, including a fully differential multiplier 314.2 and fully differential integrator 312.2. In FIG. 5, the analog correlator stage directly inputs and processes a differential voltage from the multiplier portion 314.2 and generates a differential voltage VG_calp, VG_caln. In FIG. 5, the configuration of the switches S41, S42, S43, S44 may be performed as indicated by the corresponding text in FIG. 5. In an alternative exemplary embodiment (not shown), the differential voltage VG_calp, VG_caln may be differentially applied to the transistor gates of either or both of the I mixer 161*a* and Q mixer 161*b*, e.g., VG_calp may be applied to bias the gates of M1, M4 in FIG. 2, while VG_caln may be applied to bias the gates of M2, M3 in FIG. 2. In an alternative exemplary embodiment, only VG_calp may be applied to bias the gates of M2, M3, while the gates of M1, M4 are tied to a fixed voltage (or vice versa). Such alternative exemplary embodiments are contemplated to be within the scope of the present disclosure.

Figure 6:
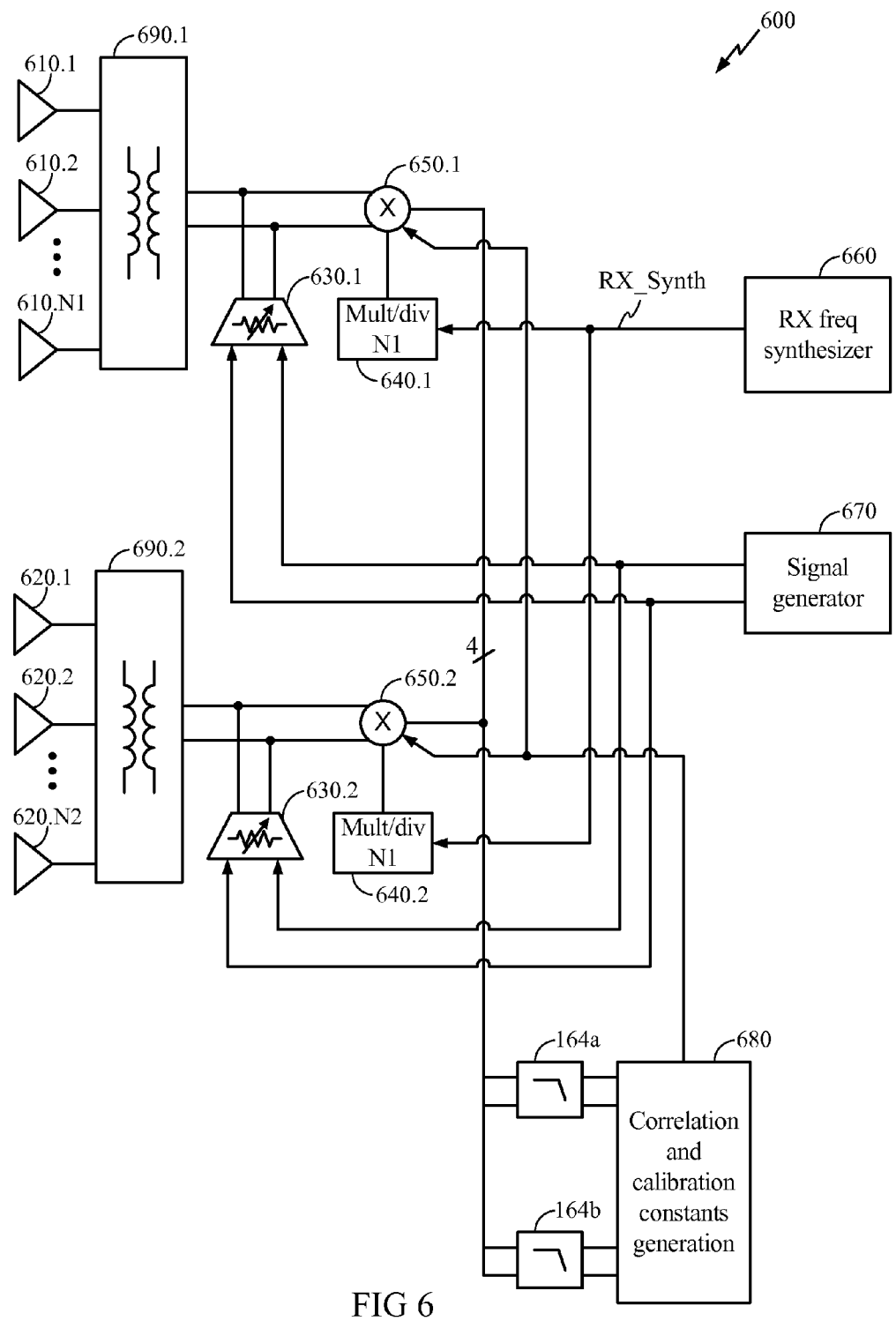
FIG. 6 illustrates an alternative exemplary embodiment of the present disclosure, wherein the receiver can accommodate a plurality of frequency bands.

FIG. 6 illustrates an alternative exemplary embodiment 600 of the present disclosure, wherein the receiver can accommodate a plurality of frequency bands. Note certain elements have been omitted from FIG. 6 for ease of illustration, as will be apparent to one of ordinary skill in the art. In FIG. 6, a primary set of LNA's 610.1 through 610.N1 is coupled to a balun 690.1. In an exemplary embodiment, each of the LNA's 610.1 through 610.N1 may be optimized, e.g., to operate at a different center frequency. For example, at any time, one of the LNA's 610.1 through 610.N1 may be enabled, and all others disabled, and a single-ended output of the enabled LNA converted by the balun 690.1 into a differential voltage for further processing.

In FIG. 6, the differential output of the balun 690.1 is coupled to I and Q mixers, collectively shown as a single block 650.1 in FIG. 6 for simplicity. An RX frequency synthesizer 660 generates an output signal RX_synth coupled to a frequency multiplier/division block 640.1. The block 640.1 may multiply or divide the frequency of RX_synth by a factor N1 to generate a local oscillator signal for the mixer block 650.1 for mixing with the mixer input. The mixer input is further coupled to a programmable attenuator element 630.1 for coupling the output of a signal generator 670 to the mixer input. The programmable attenuator element 630.1 may change the amplitude of the signal, e.g., modulated tone, from the signal generator 670 before it is coupled to the mixer input. In an exemplary embodiment, the signal generator 670 may include the signal generator 340, switch S4, and OOK modulation data generator 330 as previously described hereinabove with reference to FIG. 3. The (differential) output of the mixer block 650.1 is coupled to filters 164*a*, 164*b*, whose outputs are coupled to a correlation and calibration constants generation block 680. In an exemplary embodiment, block 680 may perform analog correlation as described with reference to FIGS. 3 and 4 hereinabove to derive calibration voltages to optimize receiver IIP2. In the exemplary embodiment shown, the output of block 680 is fed back to mixer block 650.1 to adjust the gate bias voltages of the mixer block 650.1.

FIG. 6 further illustrates a secondary set of LNA's 620.1 through 620.N2 coupled to balun 690.2, all of which may be selectively enabled or disabled according to the principles described hereinabove. One of ordinary skill in the art will appreciate that the techniques disclosed herein may generally be applied to accommodate any number of sets of LNA's (wherein a single "set" of LNA's may denote all LNA's associated with a single mixer block), and such alternative exemplary embodiments are contemplated to be within the scope of the present disclosure. In an exemplary embodiment, the secondary set of LNA's 620.1 through 620.N2 may be configured to operate over a frequency band different from that of the primary set of LNA's 610.1 through 610.N1. Note the secondary set of LNA's 620.1 through 620.N2 may be provided with a balun 690.2, a mixer 650.2, coupling element 630.2, and a frequency multiplier/divider 640.2, whose functions may be similar to the corresponding elements described for the primary set of LNA's 610.1 through 610.N1.

In an exemplary embodiment, only one LNA of one set (primary, secondary, or other set not shown) of LNA's may be operational at any time, with the other LNA's configured to be disabled. Thus, in an exemplary embodiment, to reduce hardware requirements, the secondary set of LNA's 620.1 through 620.N2 (and any other additional sets of LNA's not explicitly shown in FIG. 6) may share the RX frequency synthesizer 660 and signal generator 670 with the primary set of LNA's 610.1 through 610.N1. Furthermore, the baseband filters 164*a*, 164*b* and the correlation and calibration constants generation block 680 may also be shared between the primary and second sets of LNA's, and/or other sets of LNA's not explicitly shown in FIG. 6.

Figure 7:
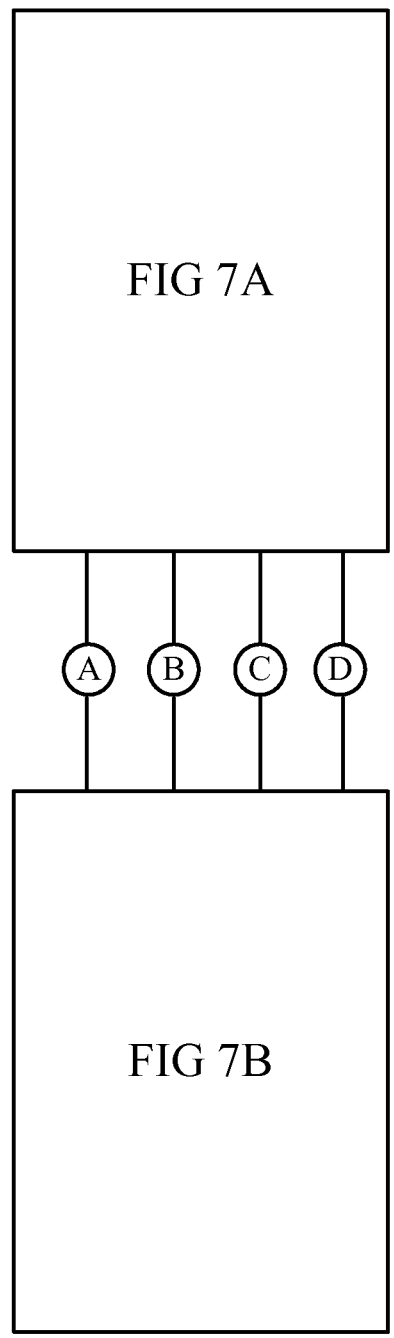
FIGS. 7, 7A, and 7B illustrate an alternative exemplary embodiment of the present disclosure, wherein the IIP2 calibration techniques may be applied to a receiver employing dual (or more) receivers.
Figure 7A:
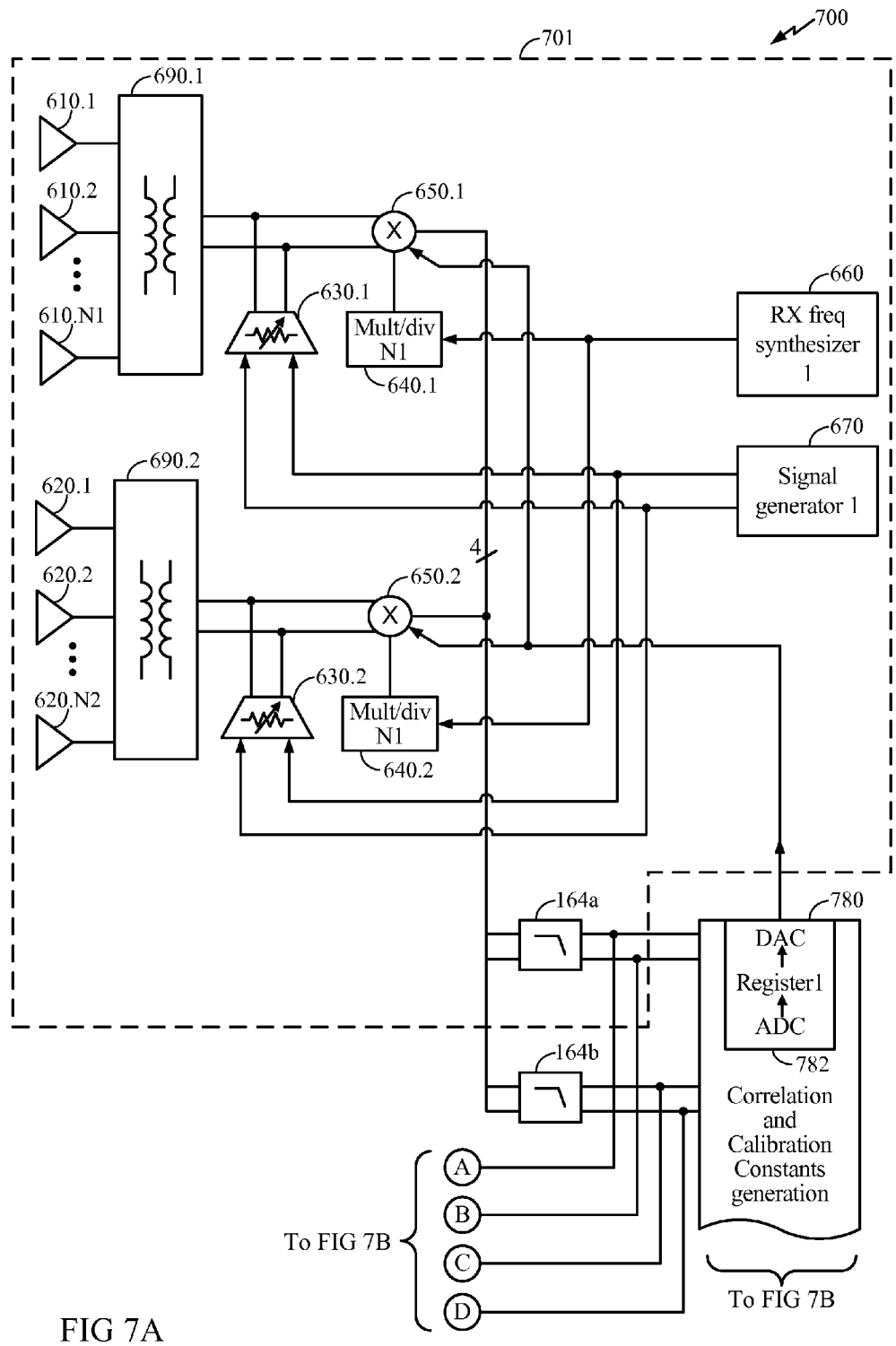
Figure 7B:
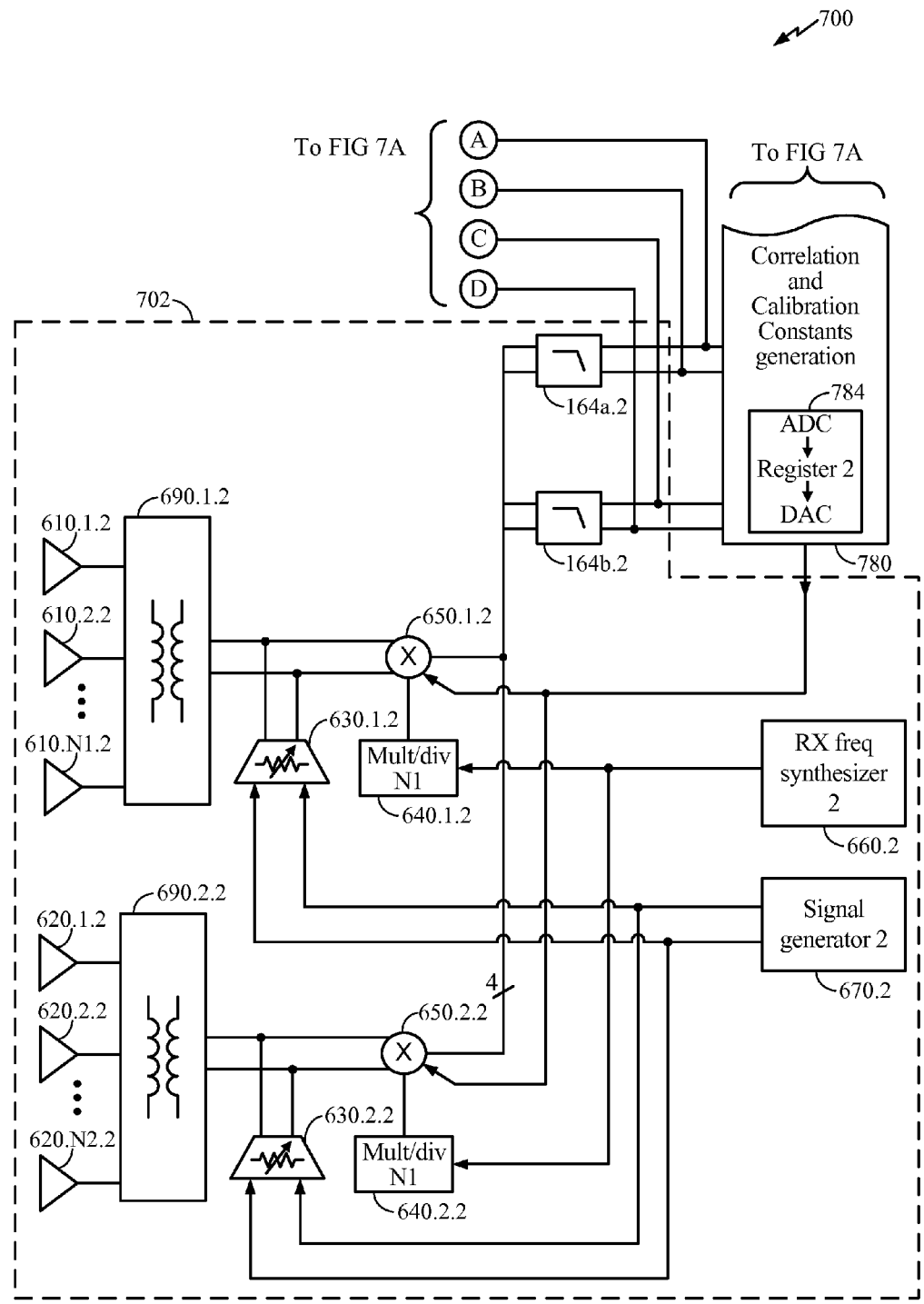

FIGS. 7, 7A, and 7B illustrate an alternative exemplary embodiment of the present disclosure, wherein the IIP2 calibration techniques may be applied to a receiver employing dual (or more) receivers. FIG. 7 shows the high-level relationship of the elements in FIGS. 7A and 7B to each other, while FIGS. 7A and 7B show the elements in detail. Similarly labeled elements in FIGS. 6 and 7, 7A, and 7B may be understood as performing similar functionality, unless otherwise noted. Furthermore, elements in FIGS. 7, 7A, and 7B within the dotted box 702, and shown as having a suffix "0.2" may correspond to elements residing in a secondary (also denoted an auxiliary or diversity) receiver path, e.g., in a dual receiver system 700 including primary receiver 701 and secondary receiver 702. For ease of description, any element described with reference to "FIG. 7" herein may be understood to refer to any element in any of FIGS. 7, 7A, and 7B, unless otherwise noted.

In FIG. 7, the primary receiver 701 includes LNA's (610.1-610.N1, 620.1-620.N2), one or more baluns (690.1, 690.2, etc.), mixers (650.1, 650.2, etc.), low-pass filters 164*a*, 164*b*, an RX frequency synthesizer 660, and a signal generator 670. Similarly, the secondary receiver 702 includes LNA's (610.1.2-610.N1.2, 620.1.2-620.N2.2), one or more baluns (690.1.2, 690.2.2, etc.), mixers (650.1.2, 650.2.2, etc.), low-pass filters 164*a*.2, 164*b*.2, an RX frequency synthesizer 660.2, and a signal generator 670.2. Note to meet the stringent coupling requirements between the receivers, separate single-tone signal generators 670 and 670.2 may be provided for the primary receiver 701 and the secondary receiver 702, respectively. In the exemplary embodiments shown, the primary receiver 701 and secondary receiver 702 may generally be provided with independent receiver elements as enumerated above, except for a common correlation and calibration constants generation block 780, which may be shared, e.g., time-shared, between the primary receiver 701 and the secondary receiver 702 to reduce the hardware requirements of the system. Note in alternative exemplary embodiments (not shown), the block 780 need not be shared between the primary receiver 701 and the secondary receiver 702, and separate analog correlation blocks may be provided for each of the different receivers. Such alternative exemplary embodiments are contemplated to be within the scope of the present disclosure.

In an exemplary embodiment, the output of the block 780 for the primary receiver 701 may be digitized and stored in a first memory block 782, which allows for maintaining the determined optimal settings of the gate calibration voltages for the mixers 650.1, 650.2 (and possibly other mixers of the primary receiver 701 not shown) during normal operation of the first receiver 701. The output of the block 780 for the secondary receiver 702 may similarly be digitized and stored in a second memory block 784, which may function according to principles, and thus have corresponding advantages, similar to those described hereinabove for the first memory block 782.

The techniques of the present disclosure may be applied in a diversity receiver having a primary receiver 701 and secondary receiver 702 according to a particular exemplary embodiment as follows. In particular, when the primary receiver 701 is being calibrated according to the IIP2 calibration scheme described herein, either or both of the LPF's 164*a*.2 and 164*b*.2 of the secondary receiver 702 may be used to implement the portions of the analog correlator 310, e.g., the multiplier 314 and the integrator 312 of the analog correlator 310.

In this case, the elements in the rest of the secondary receiver 702 may be disabled, while IIP2 calibration for the primary receiver 701 takes place. Similarly, when the secondary receiver 702 is being calibrated according to the IIP2 calibration scheme, either or both of the LPF's 164*a* and 164*b* of the primary receiver 701 may be used to implement the analog filter portion of the analog correlator 310. In this case, the elements in the rest of the primary receiver 701 may be disabled, while IIP2 calibration for the primary receiver 702 takes place.

Figure 10:
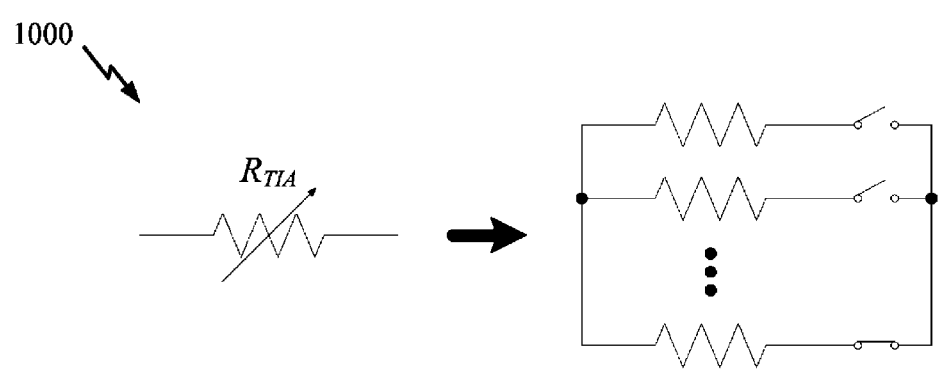
FIGS. 10, 11, 12, 12A, and 12B illustrate certain principles for implementing the LPF's using one (e.g., primary or secondary) receiver, and an integrator using another (e.g., secondary or primary) receiver.
Figure 11:
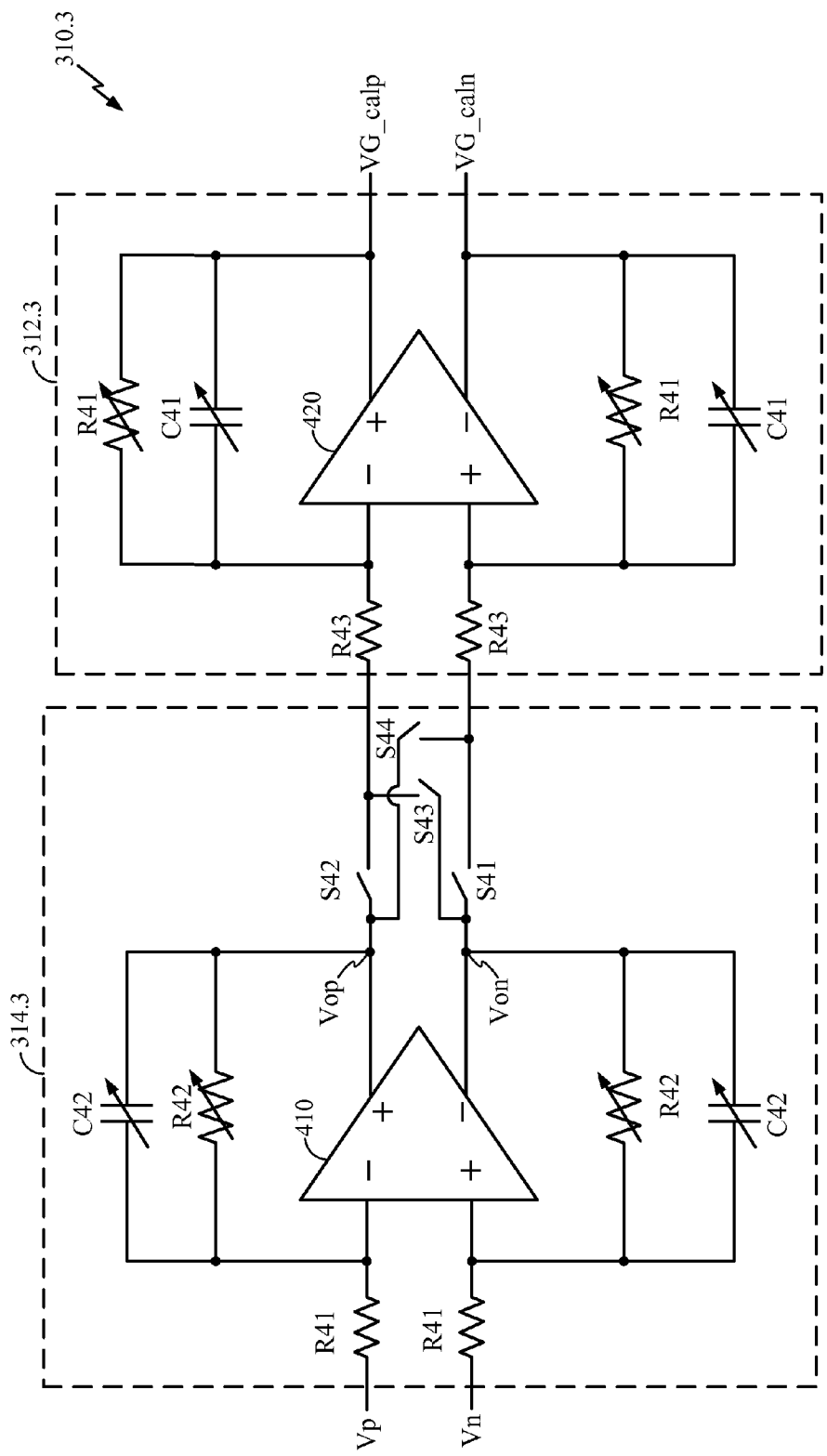

The aforementioned reuse of the BB LPF's of the receivers may be accomplished using, e.g., a plurality of switches configurable to selectively couple the inputs and the outputs of the baseband filters to the appropriate system nodes according to the desired mode of operation. FIGS. 10, 11, 12, 12A, and 12B illustrate certain principles for implementing the LPF's 164*a* or 164*b* using one (e.g., primary or secondary) receiver, and an integrator 310 using another (e.g., secondary or primary) receiver. In particular, FIG. 10 illustrates a resistor 1000 having programmable resistance, wherein an array of parallel resistors is provided with a series switch coupled to each one of the parallel resistors. The total value of R41 may then be determined by selectively opening or closing the switches associated with the parallel resistors. FIG. 11 illustrates an exemplary embodiment 310.3 of a correlator in which variable resistances R42 and R41 are provided for the multiplier 314.3 and integrator 312.3, respectively.

Figure 12:
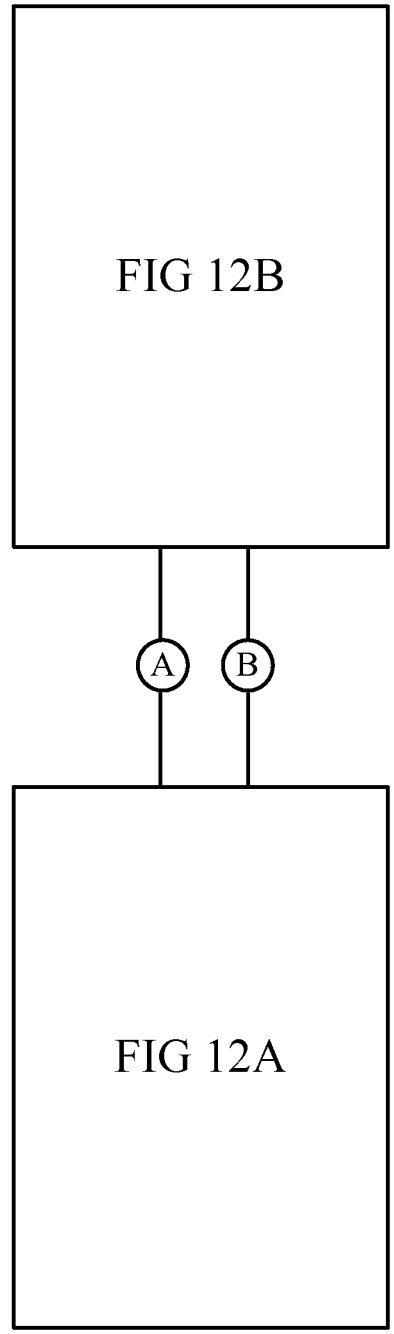
Figure 12A:
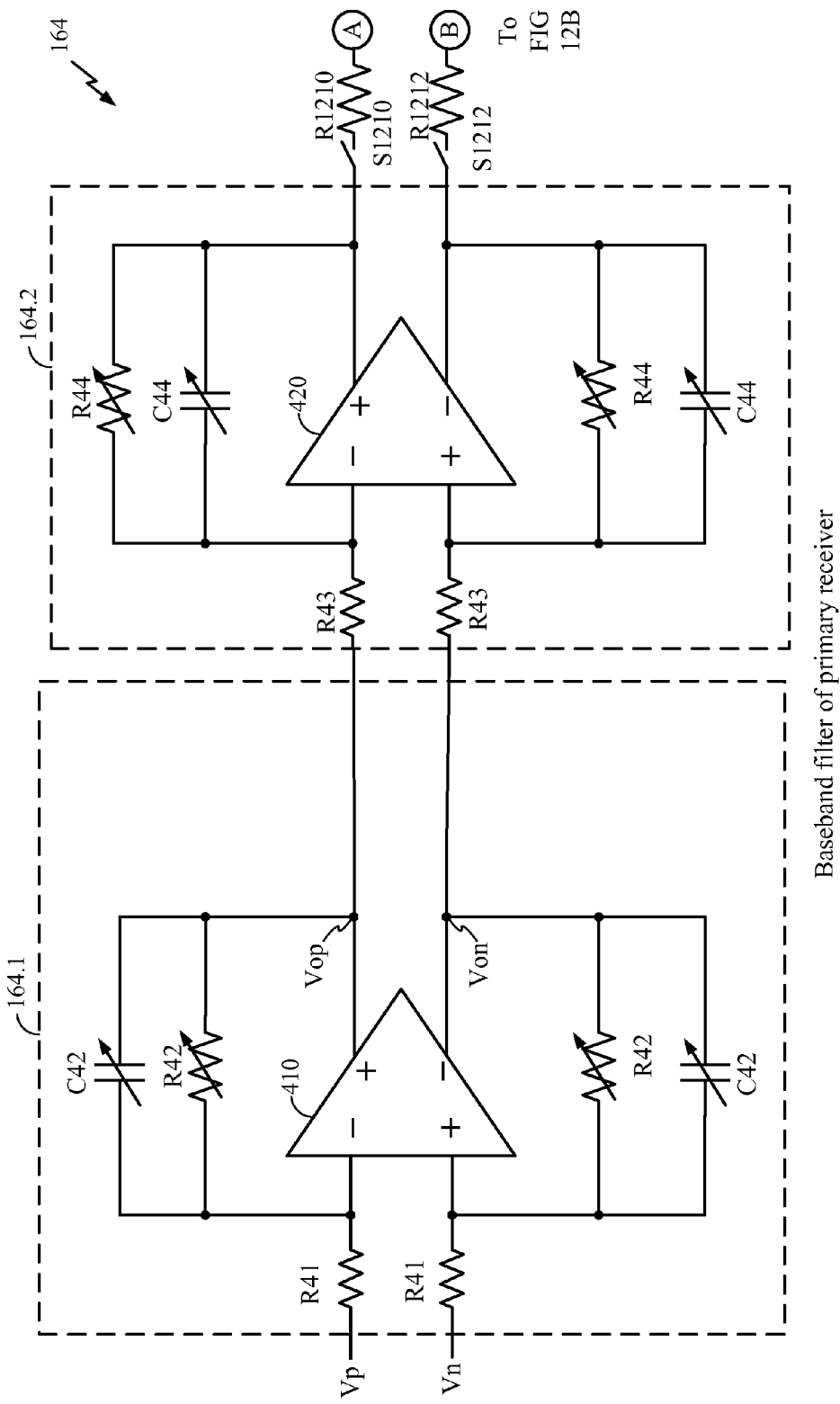
Figure 12B:
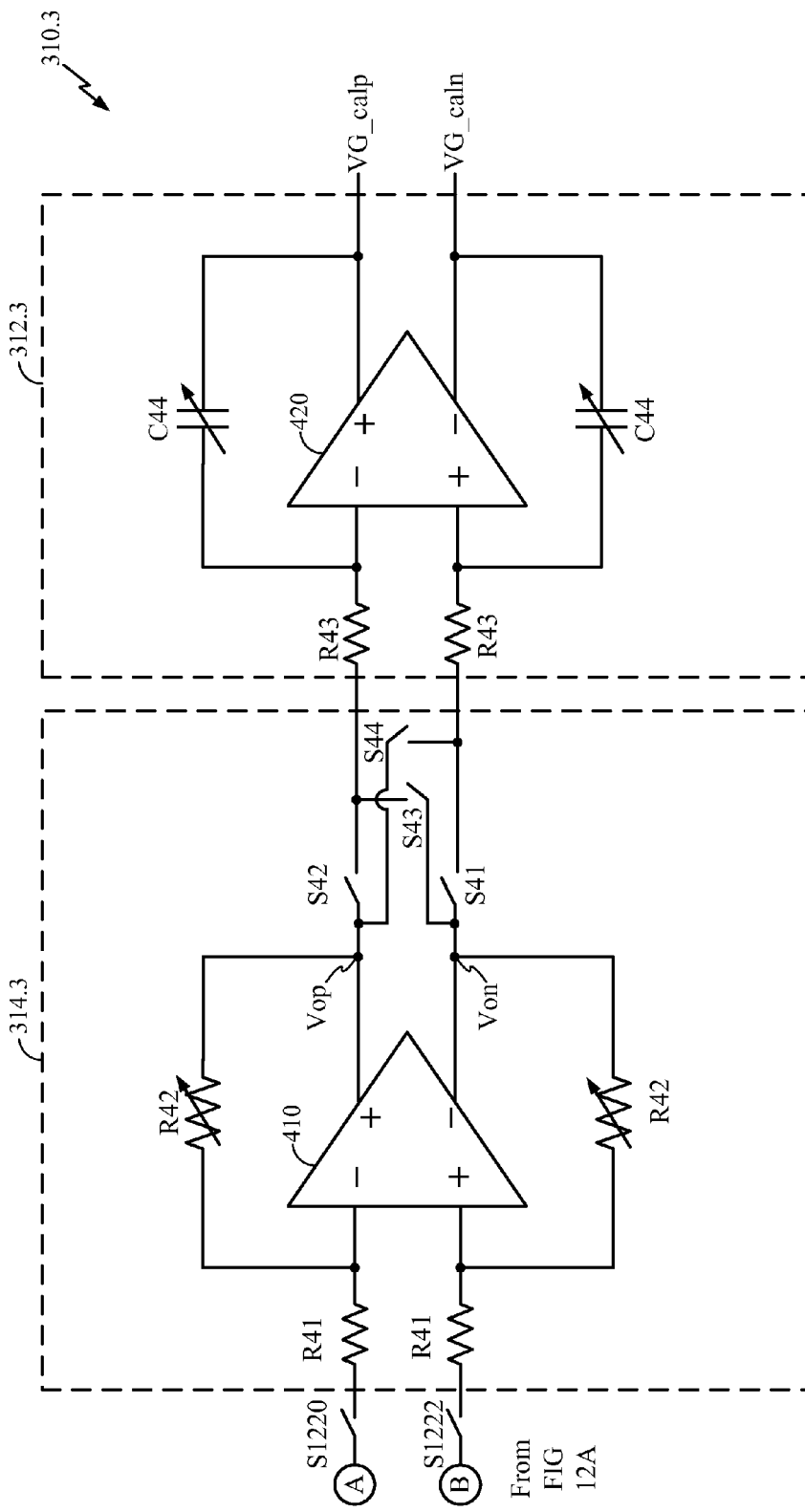

FIGS. 12, 12A, and 12B illustrate an exemplary embodiment of a combination baseband filter and integrator implemented using filters of the primary and secondary receiver according to the present disclosure. FIG. 12 shows the high-level relationship of the elements in FIGS. 12A and 12B to each other, while FIGS. 12A and 12B show the elements in detail. Similarly labeled elements in FIGS. 5 and 12, 12A, and 12B may be understood as performing similar functionality, unless otherwise noted. For ease of description, any element described with reference to "FIG. 12" herein may be understood to refer to any element in any of FIGS. 12, 12A, and 12B, unless otherwise noted.

In FIG. 12, a baseband filter 164 of a primary receiver is configured as shown, using two serial sections 164.1 and 164.2. Note a baseband filter of a secondary receiver (e.g., in a diversity receiver implementation) may also be configured in an analogous manner to that described in FIG. 12 for the primary receiver, e.g., when IIP2 calibration is to be performed for the secondary receiver, then two serial sections in the secondary receiver analogous to sections 164.1, 164.2 may perform baseband filtering for the secondary receiver, while sections 164.1, 164.2 for the primary receiver may be used to perform analog correlation (i.e., multiplication and integration) for the secondary receiver. Such alternative exemplary embodiments are contemplated to be within the scope of the present disclosure.

In an exemplary embodiment, the sections 164.1 and 164.2 may be implemented using the architecture of FIG. 11 as the underlying circuit topology, e.g., switches S41, S42 may be closed, and S43, S44 opened. The outputs of section 164.2 may be selectively coupled via switches S1210, S1212, resistors R1210, R1212, and further switches S1220, S1222 to a correlator 310.3 residing on a secondary receiver. The correlator 310.3 includes a multiplier 314.3 and an integrator 312.3. Note the correlator 310.3 may also be implemented using the architecture of FIG. 11 as the underlying circuit topology, e.g., the capacitors otherwise present in 314.3 may be disabled by opening the corresponding series-coupled switches, and the resistors otherwise present in 312.3 may also be disabled by opening the corresponding series-coupled switches. In this manner, the baseband filters of the secondary receiver may be programmed to serve as the correlator for the primary receiver during IIP2 calibration of the primary receiver, and vice versa.

Figure 8:
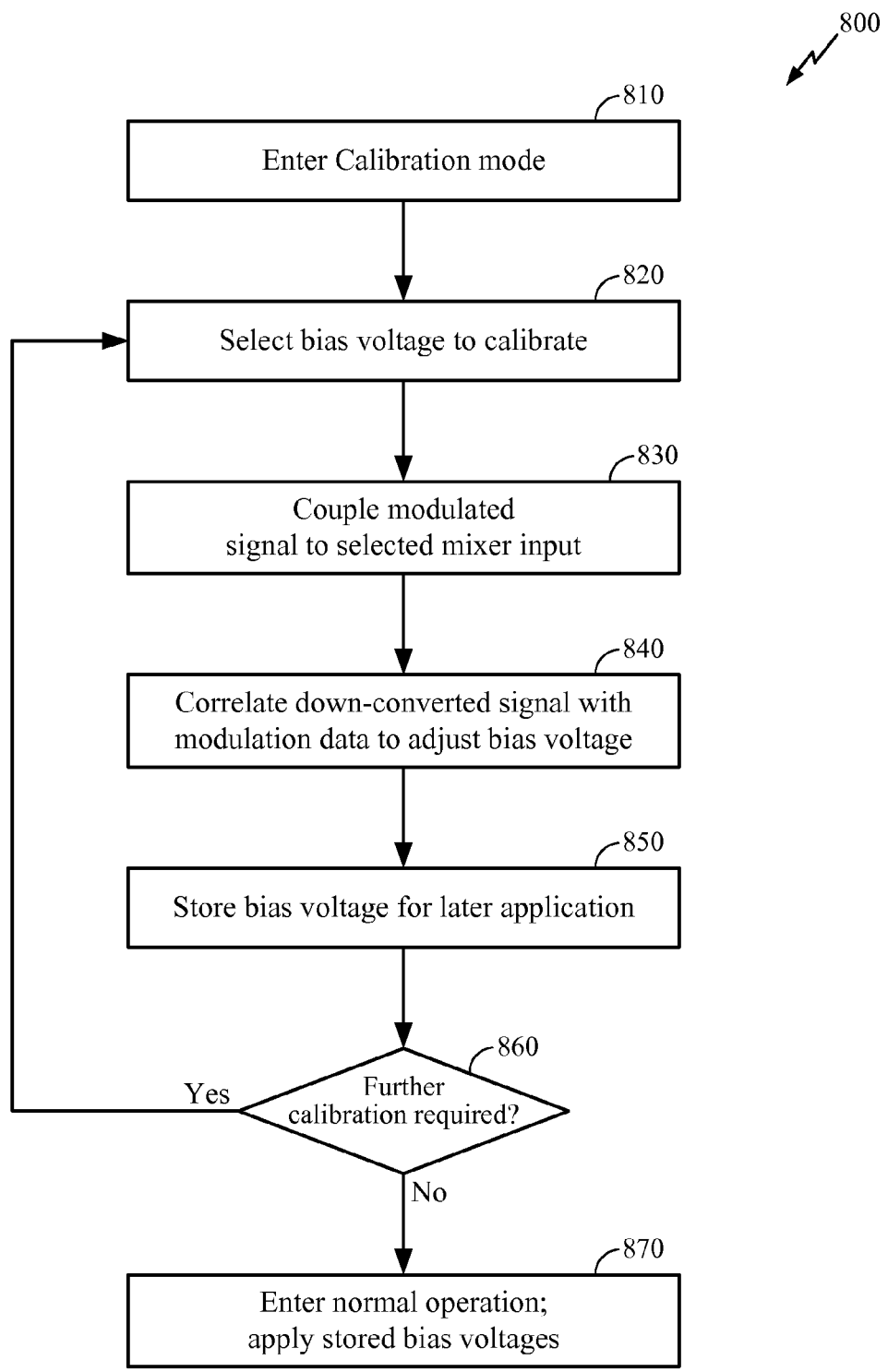
FIG. 8 illustrates an exemplary embodiment of a method for IIP2 calibration using the principles disclosed herein.

FIG. 8 illustrates an exemplary embodiment of a method 800 for IIP2 calibration using the principles disclosed herein. Note the method may be described with reference to elements labeled in FIG. 3, although it will be appreciated that similar methods (not explicitly described herein) may be derived and applied to perform calibration for any of the architectures described herein, e.g., those illustrated in FIGS. 6 and 7. Such alternative exemplary embodiments are contemplated to be within the scope of the present disclosure.

In FIG. 8, at block 810, the receiver enters a calibration mode.

At block 820, a bias voltage is selected for calibration. In an exemplary embodiment, the bias voltage selected may correspond to either the I mixer 161*a* or the Q mixer 161*b* of FIG. 3. Furthermore, the bias voltage selected may correspond to calibration voltages within the mixer 650.1 or 650.2 of FIG. 6, or any of the mixers 650.1, 650.2, 650.1.2, 650.2.2 of FIG. 7.

At block 830, a modulated signal is selectively coupled to the selected mixer input. In an exemplary embodiment, the modulated signal may correspond to the OOK-modulated output signal from signal generator 340 in FIG. 3.

At block 840, the down-converted signal is correlated with the modulation data to adjust the selected bias voltage to calibrate. In an exemplary embodiment, the correlation may be performed using the analog correlator 310.

At block 850, the bias voltage may be stored for later application. In an exemplary embodiment, a bias voltage generated by an analog correlator may be digitized, stored in digital memory, and later re-converted back to analog for application, as previously described hereinabove.

At block 860, it is determined whether further calibration is required. For example, in an exemplary embodiment, the plurality of gate bias voltages for the mixers in a receiver supporting multiple bands and/or secondary paths may be sequentially calibrated, one after the other. If further calibration is required, the method may return to block 820. If not, the method may proceed to block 870.

At block 870, the method enters normal operation, wherein the receiver receives RF signals over the air for normal processing. Further during normal operation, the stored bias voltages, e.g., as stored in memory at block 850, may be applied to reduce receiver IIP2, per the techniques of the present disclosure.

In alternative exemplary embodiments (not shown), one of ordinary skill in the art will appreciate that the calibration techniques shown in FIG. 8 may readily be modified to accommodate any number of mixers, LNA's, correlators, etc., that are available in the system, and such alternative exemplary embodiments are contemplated to be within the scope of the present disclosure.

It will be appreciated that, in alternative exemplary embodiments of the present disclosure, the LNA can be single-ended, in which case a balun may be provided between the single-ended LNA and differential mixer for single-ended-to-differential conversion. Furthermore, it will be noted that the output of a single-ended version (not shown in FIG. 3) of the signal generator 340 can be injected into the single-ended input of such an LNA, or any internal single-ended LNA node. Assuming the LNA is single-ended and the IIP2 is dominated by the mixer, then the output of the signal generator only needs to be injected into one of the multiple LNAs for each mixer (note multiple LNAs can be coupled to a single mixer since a mixer usually has wider bandwidth). Thus in this case, the number of routings from the signal generator output to the (single) LNA of the receiver may be the same or similar to the case wherein the output of the signal generator is directly injected into the mixer.

Figure 9:
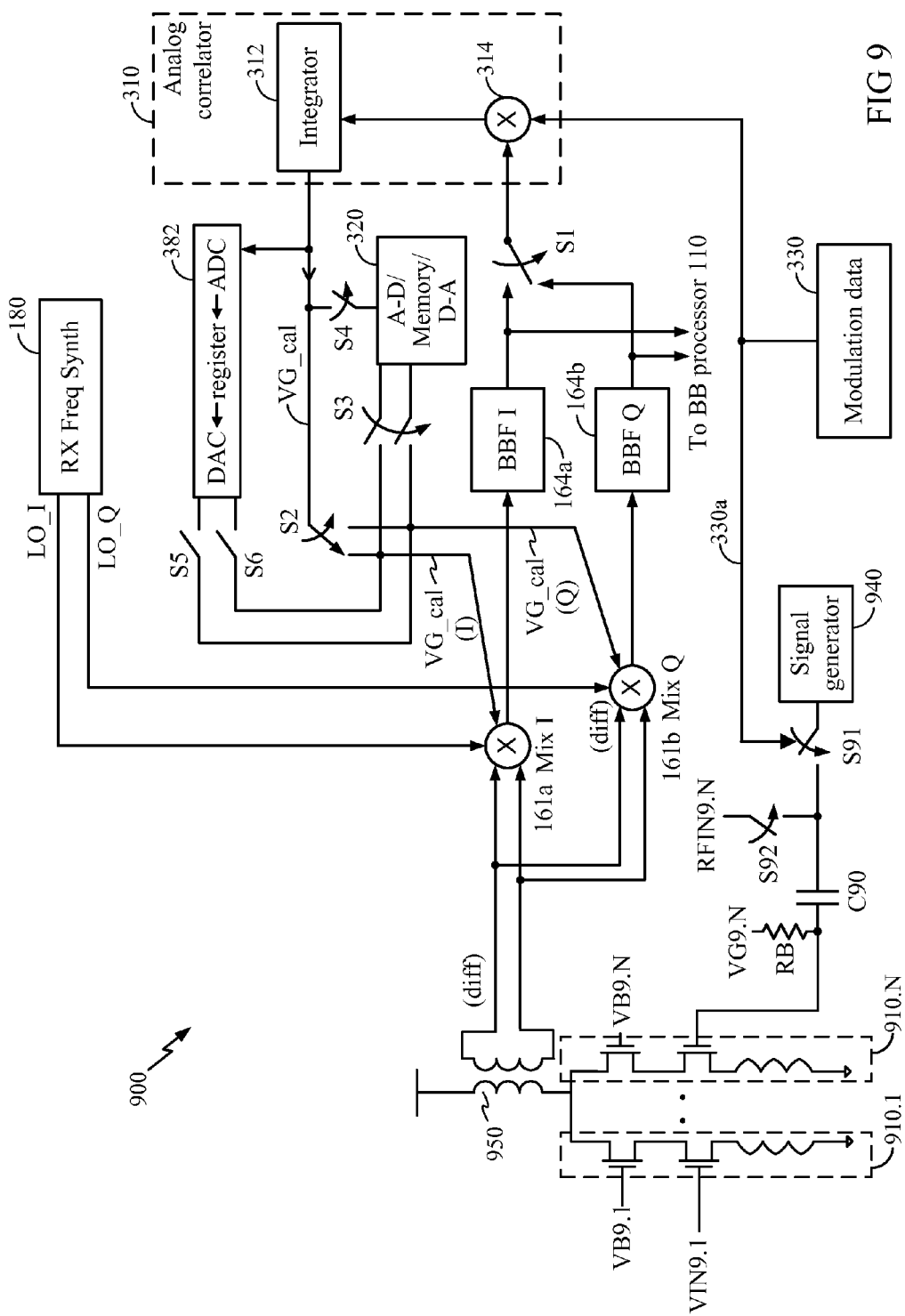
FIG. 9 illustrates an alternative exemplary embodiment of the present disclosure, wherein IIP2 calibration is performed with the output of the signal generator being directly coupled to the input of a single LNA in the receiver.

FIG. 9 illustrates an alternative exemplary embodiment 900 of the present disclosure, wherein IIP2 calibration is performed with the output of the signal generator 940 being directly coupled to the input of a single LNA in the receiver. Note FIG. 9 is shown for illustrative purposes only, and is not meant to limit the scope of the present disclosure.

In FIG. 9, a plurality N of LNA's 910.1 through 910.N (with 910.2 through 910.N-1 represented with ellipses) is shown. For illustrative purposes, each of the LNA's 910.1 through 910.N is shown in a cascode configuration with inductor source degeneration, although it will be appreciated that the scope of the present disclosure is not limited to such specific LNA configurations. Other techniques for designing an LNA are known in the art, e.g., multi-cascode configurations and/or other non-cascode types of circuit topologies, and such alternative exemplary embodiments are contemplated to be within the scope of the present disclosure. In FIG. 9, for the LNA 910.1, a bias voltage VB9.1 is coupled to the gate of a cascode transistor, and an input voltage VIN9.1 is coupled to an input transistor of the LNA 910.1. Note the input voltage VIN9.1 may include a DC component and an input RF component (not shown).

LNA 910.N also includes a cascode transistor having a gate coupled to the bias voltage VB9.N. LNA910.N further includes an input transistor (not labeled in FIG. 9) coupled via a bias resistor RB to a gate bias voltage VG9.N. The gate of the input transistor of LNA 910.N is further coupled to an RF input voltage RFIN9.N via switch S92, and to the output of a signal generator 940 via switch S91. In an exemplary embodiment, during an IIP2 calibration phase, switch S92 may be opened, switch S91 may be selectively opened and closed to couple or decouple the output of signal generator 940 to the input transistor of the LNA 910.1. In an exemplary embodiment, the selective closing and opening are based on binary data 330a provided by a modulation data generator 330 to implement on-off keying (OOK), as earlier described hereinabove with reference to FIG. 3.

Note the output of signal generator 940 is provided as a single-ended voltage for coupling to the single-ended RF input of the LNA 910.N. It will be appreciated that similar techniques as described hereinabove may readily be applied to accommodate an LNA (not shown) having a differential input. Such alternative exemplary embodiments are contemplated to be within the scope of the present disclosure.

In light of the techniques disclosed hereinabove, it will be appreciated that the exemplary embodiment 900 of FIG. 9 couples the interferer signal generated by signal generator 940 to the input of LNA 910.N, rather than to the (differential) input of mixers 161a, 161b, as described with reference to the exemplary embodiment 300 of FIG. 3. Nevertheless, the adjustment of the bias voltages of the mixers 161a, 161b may proceed as described hereinabove with reference to FIG. 3. Note while an exemplary embodiment 900 is shown in FIG. 9 wherein the modulated output of the signal generator 940 is coupled to the input of LNA 910.N, in alternative exemplary embodiments, the modulated output of the signal generator may alternatively or in conjunction be coupled to any point in the receive signal path to perform IIP2 calibration according to the present disclosure. Such alternative exemplary embodiments are contemplated to be within the scope of the present disclosure.

Figure 13:
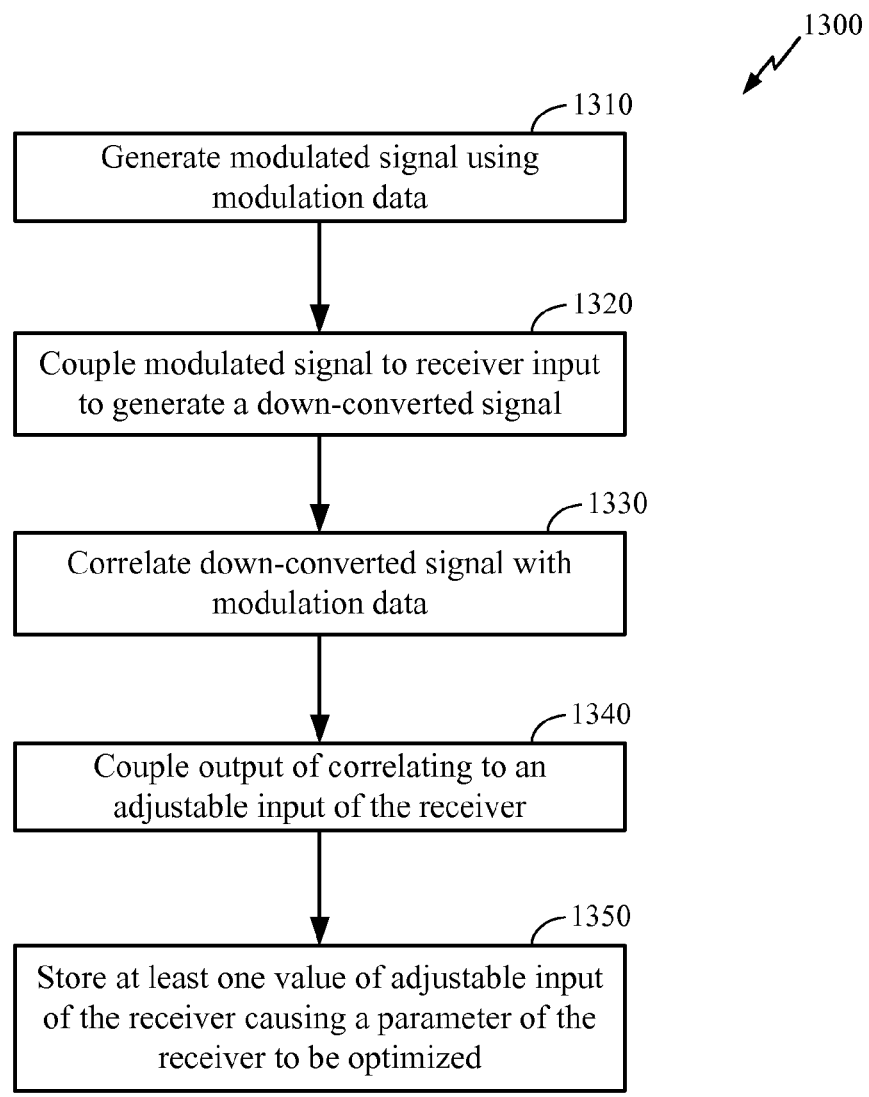
FIG. 13 illustrates an alternative exemplary embodiment of a method according to the present disclosure.

FIG. 13 illustrates an alternative exemplary embodiment 1300 of a method according to the present disclosure. Note FIG. 13 is shown for illustrative purposes only, and is not meant to limit the scope of the present disclosure to any particular exemplary embodiment of a method shown.

In FIG. 13, at block 1310, a modulated signal is generated using modulation data.

At block 1320, the modulated signal is coupled to a receiver input to generate a down-converted signal.

At block 1330, the down-converted signal is correlated with the modulation data, the correlating comprising using an analog correlation block.

At block 1340, the output of the correlating is coupled to an adjustable input of the receiver.

At block 1350, at least one value of the adjustable input of the receiver causing a parameter of the receiver to be optimized is stored.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
a signal generator configured to generate a modulated input signal comprising modulation data;
a receiver comprising a mixer configured to mix a signal derived from the modulated input signal with a local oscillator signal to generate a mixer output;
an analog multiplier configured to multiply an input signal with the modulation data; and
an analog integrator configured to integrate the output of the analog multiplier to generate an analog correlator output signal;
wherein an adjustable input of the receiver is coupled to the analog correlator output signal.

2. The apparatus of claim 1, wherein the adjustable input of the receiver comprises a bias voltage of the mixer.

3. The apparatus of claim 1, wherein the signal derived from the modulated input signal is the modulated input signal directly coupled to an input of the mixer.

4. The apparatus of claim 1, wherein the signal derived from the modulated input signal is the modulated input signal coupled to an input of a low-noise amplifier having an output coupled to an input of the mixer.

5. The apparatus of claim 1, the analog multiplier comprising an amplifier having a differential output, a first terminal of the differential output coupled to a first switch, and the second terminal of the differential output coupled to a second switch, the first switch alternately switched on and off based on the modulation data, the second switch alternately switched on and off in a reverse manner from the first switch.

6. The apparatus of claim 5, the first and second switches further coupled to the input of the analog integrator, wherein the analog integrator comprises an operational amplifier having at least one feedback-coupled integrating capacitor.

7. The apparatus of claim 6, the analog integrator comprising a differential input comprising a positive terminal and a negative terminal, the positive terminal coupled to the output of the first switch, the negative terminal coupled to the output of the second switch, wherein the first terminal of the differential output of the analog multiplier amplifier is coupled to the negative terminal by a third switch, and the second terminal of the differential output of the analog multiplier amplifier is coupled to the positive terminal by a fourth switch, wherein the third switch is switched on and off in phase with the second switch, and the fourth switch is switched on and off in phase with the first switch.

8. The apparatus of claim 7, the analog integrator further comprising a differential output, wherein the analog correlator output signal comprises the differential output of the analog integrator, wherein the adjustable input of the receiver comprises a differential bias voltage of the mixer, and wherein the differential output of the analog integrator is coupled to the differential bias voltage of the mixer.

9. The apparatus of claim 7, the analog integrator further comprising a differential output, wherein the analog correlator output signal comprises the differential output of the analog integrator, wherein the adjustable input of the receiver comprises a differential bias voltage of a low-noise amplifier, and wherein the differential output of the analog integrator is coupled to the differential bias voltage of the low-noise amplifier.

10. The apparatus of claim 7, wherein the output of the analog integrator is coupled to a bias voltage of the low-noise amplifier.

11. The apparatus of claim 5, the modulated input signal comprising an amplitude-modulated input signal, the amplitude modulation comprising on-off keying a single-tone carrier using the modulation data, and the modulation data comprises a sequence of alternating bits, wherein the analog multiplier may be disabled in an idle mode, and wherein the analog multiplier is configured to be in the idle mode when the modulation data turns off the single-tone carrier.

12. The apparatus of claim 1, the modulated input signal comprising an amplitude-modulated input signal, the amplitude modulation comprising on-off keying a single-tone carrier using the modulation data, and the modulation data comprises a sequence of alternating bits.

13. The apparatus of claim 1, the primary receiver comprising an in-phase (I) mixer, the primary receiver further comprising a quadrature (Q) mixer, wherein the adjustable input of the receiver comprises a gate bias voltage of the I and Q mixers, and wherein the analog correlator output signal is alternately coupled to the gate bias voltage of the I mixer and the Q mixer successively in time.

14. The apparatus of claim 1, the mixer comprising an in-phase (I) mixer, the primary receiver further comprising a quadrature (Q) mixer, the analog correlator comprising a first analog correlator, the apparatus further comprising a second analog correlator configured to correlate the modulation data with a signal coupled to the output of the Q mixer, wherein an output of the first analog correlator is coupled to the gate bias voltage of the I mixer, and wherein an output of the second analog correlator is coupled to the gate bias voltage of the Q mixer.

15. The apparatus of claim 1, further comprising:
an analog-to-digital converter for converting the analog correlator output signal to a digital signal;
a memory for storing the output of the analog-to-digital converter; and
a digital-to-analog converter for converting a stored value in the memory to an analog value; wherein the analog value is configurable to be coupled to the adjustable input of the receiver in lieu of the analog correlator output signal.

16. The apparatus of claim 1, further comprising:
at least one balun;
a plurality of low-noise amplifiers (LNA's) having outputs coupled to the at least one balun to convert a single-ended signal to a differential signal;
wherein the input to the mixer is coupled to both the modulated input signal and the differential output signal of the at least one balun, and the plurality of LNA's are configurable to be selectively disabled.

17. The apparatus of claim 16, wherein:
the at least one balun comprises a plurality of baluns, each balun coupled to a corresponding plurality of low-noise amplifiers;
the apparatus further comprising a mixer associated with each of the plurality of baluns, each of the inputs to the mixers being selectable from the modulated input signal or a differential output signal of the associated balun.

18. The apparatus of claim 1, further comprising a secondary receiver, the secondary receiver comprising a receive processing chain for down-converting a radio-frequency signal, the receive processing chain comprising a low-pass filter, wherein:
in a calibration mode of the primary receiver, the analog multiplier and integrator of the analog correlator utilize components in the low-pass filter of the secondary receiver.

19. The apparatus of claim 18, the low-pass filter of the secondary receiver comprising:
a first amplifier serial section comprising a feedback path having configurable resistance and configurable capacitance coupled in parallel, wherein the first amplifier serial section is configurable to disable the configurable capacitance, and the first amplifier serial section is further configurable to disable the configurable resistance;
a second amplifier serial section comprising a feedback path having configurable resistance and configurable capacitance coupled in parallel, wherein the second amplifier serial section is configurable to disable the configurable capacitance, and the second amplifier serial section is further configurable to disable the configurable resistance;
wherein, when the primary receiver is in the calibration mode, the first amplifier serial section is configured to disable the configurable capacitance to implement the analog multiplier, and the second amplifier serial section is configured to disable the configurable resistance to implement the analog integrator.

20. A method comprising:
generating a modulated input signal comprising modulation data;
using a receiver, mixing a signal derived from the modulated input signal with a local oscillator signal to generate a mixer output;
multiplying an input signal with the modulation data;
integrating the output of the multiplying to generate an analog correlator output signal; and
coupling an adjustable input of the receiver to the analog correlator output signal.

21. The method of claim 20, further comprising:
storing at least one value of the adjustable input of the receiver causing a parameter of the receiver to be optimized.

22. An apparatus comprising:
means for generating a modulated input signal comprising modulation data;
means for, using a receiver, mixing a signal derived from the modulated input signal with a local oscillator signal to generate a mixer output;
means for multiplying an input signal with the modulation data;
means for integrating the output of the multiplying to generate an analog correlator output signal; and
means for coupling an adjustable input of the receiver to the analog correlator output signal.

* * * * *